United States Patent
Chainer et al.

(10) Patent No.: US 9,107,327 B2
(45) Date of Patent: *Aug. 11, 2015

(54) DATA CENTER COOLING METHOD

(75) Inventors: Timothy J. Chainer, Putnam Valley, NY (US); Hien P. Dang, Nanuet, NY (US); Pritish R. Parida, Fishkill, NY (US); Mark D. Schultz, Ossining, NY (US); Arun Sharma, New Rochelle, NY (US)

(73) Assignee: International Business Machines Corporation, Armonk, NY (US)

(*) Notice: Subject to any disclaimer, the term of this patent is extended or adjusted under 35 U.S.C. 154(b) by 342 days.

This patent is subject to a terminal disclaimer.

(21) Appl. No.: 13/551,929

(22) Filed: Jul. 18, 2012

(65) Prior Publication Data

US 2014/0020885 A1    Jan. 23, 2014

(51) Int. Cl.
*G05D 23/00* (2006.01)
*H05K 7/20* (2006.01)
*G06F 1/20* (2006.01)

(52) U.S. Cl.
CPC ............ *H05K 7/20836* (2013.01); *G06F 1/206* (2013.01)

(58) Field of Classification Search
CPC ....................................... F25D 31/00
USPC ........................ 700/299; 62/196.3
See application file for complete search history.

(56) References Cited

U.S. PATENT DOCUMENTS

| | | | |
|---|---|---|---|
| 5,412,535 A | 5/1995 | Chao | 361/700 |
| 7,808,780 B2 | 10/2010 | Brunschwiler et al. | 361/679.53 |
| 7,963,119 B2 | 6/2011 | Campbell et al. | 62/259.2 |
| 8,001,403 B2 | 8/2011 | Hamilton et al. | 713/320 |
| 8,019,477 B2 | 9/2011 | Bash et al. | 700/276 |
| 8,107,234 B2 | 1/2012 | Brunschwiler et al. | 361/679.53 |
| 8,127,298 B2 | 2/2012 | Kato et al. | 718/104 |
| 8,180,494 B2 | 5/2012 | Dawson et al. | 700/278 |
| 2009/0296342 A1* | 12/2009 | Matteson et al. | 361/679.46 |
| 2010/0032142 A1 | 2/2010 | Copeland | 165/104.33 |
| 2010/0236772 A1* | 9/2010 | Novotny et al. | 165/287 |
| 2011/0029152 A1 | 2/2011 | Patel et al. | 700/300 |
| 2011/0056675 A1 | 3/2011 | Barringer et al. | 165/299 |
| 2011/0060470 A1 | 3/2011 | Campbell et al. | 700/282 |
| 2011/0100045 A1* | 5/2011 | Carlson | 62/259.2 |

* cited by examiner

*Primary Examiner* — Mohammad Ali
*Assistant Examiner* — Emilio J Saavedra
(74) *Attorney, Agent, or Firm* — Ido Tuchman; Anne V. Dougherty

(57) ABSTRACT

A method aspect for removing heat from a data center may use liquid coolant cooled without vapor compression refrigeration on a liquid cooled information technology equipment rack. The method may also include regulating liquid coolant flow to the data center through a range of liquid coolant flow values with a controller-apparatus based upon information technology equipment temperature threshold of the data center.

20 Claims, 25 Drawing Sheets

External Loop Flow Rate and External Fans RPM as function of Delta T

Fp(T) is external flow required for a given delta T ..........
**Fp = 37.43*((-1.0916*Tp + 9.1526)^-1.01);**

Ff(T) is external fan rpm required for a given delta T ..........
**Ff = 669.33*((-0.7107*Tf + 6.2004)^-0.8197);**

DATA CENTER COOLING METHOD

GOVERNMENT RIGHTS

This invention was made with Government support under Contract No.: DE-EE0002894 (awarded by Department of Energy (DOE)). The Government has certain rights in this invention.

BACKGROUND

The disclosure relates to the field of computer systems, and, more particularly, to data centers housing computer systems.

A data center is a collection of computer systems and associated subsystems housing such. Data centers usually include chillers as part of the environmental control system that regulates the temperature of the computer systems and associated subsystems housed by the data center.

SUMMARY

A method aspect for removing heat from a data center may use liquid coolant cooled without vapor compression refrigeration on a liquid cooled information technology equipment rack. The method may also include regulating liquid coolant flow to the data center through a range of liquid coolant flow values with a controller-apparatus based upon information technology equipment temperature threshold of the data center.

Another method aspect for removing heat from a data center may use liquid coolant cooled without vapor compression refrigeration on a liquid cooled information technology equipment rack. The method may also include regulating liquid coolant flow to the data center through a range of liquid coolant flow values with a controller-apparatus based upon information technology equipment temperature threshold of the data center, and the controller-apparatus includes a computer processor. The method may further include determining a cooling system pump rpm and/or a fan rpm based upon the data center's power consumption and/or information technology equipment operating temperature.

Another method aspect for removing heat from a data center may use liquid coolant cooled without vapor compression refrigeration on a liquid cooled information technology equipment rack. The method may also include regulating liquid coolant flow to the data center through a range of liquid coolant flow values with a controller-apparatus based upon information technology equipment temperature threshold of the data center, and the controller-apparatus includes a computer processor. The method may further include regulating the data center energy usage by using the controller-apparatus according to a user selected upper target temperature and/or a user selected lower target temperature.

DETAILED DESCRIPTION

Embodiments will now be described more fully hereinafter with reference to the accompanying drawings, in which preferred embodiments are shown. Like numbers refer to like elements throughout.

Figure 1:
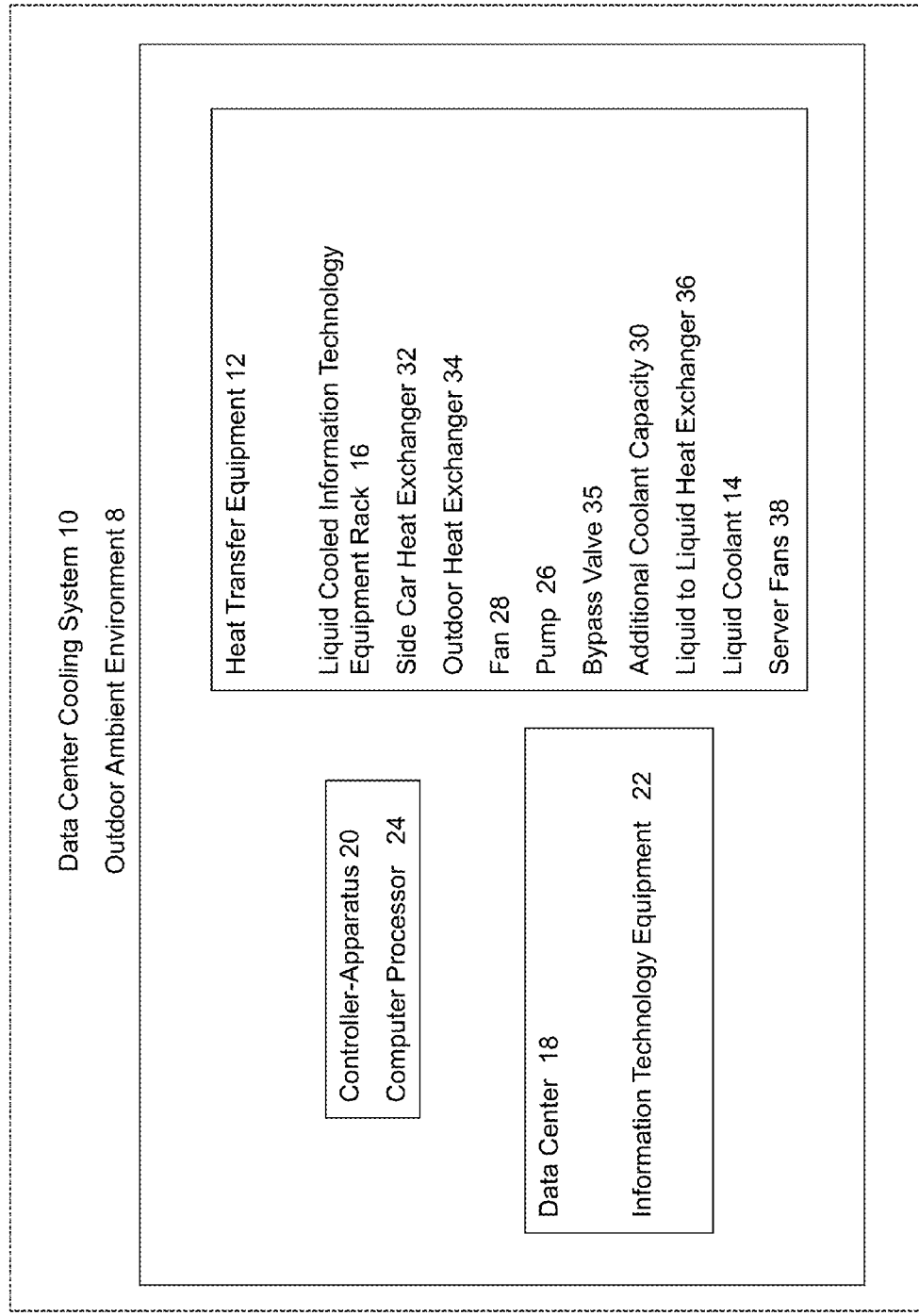
FIG. 1 is a block diagram illustrating a data center cooling system in accordance with various embodiments.
Figure 17:
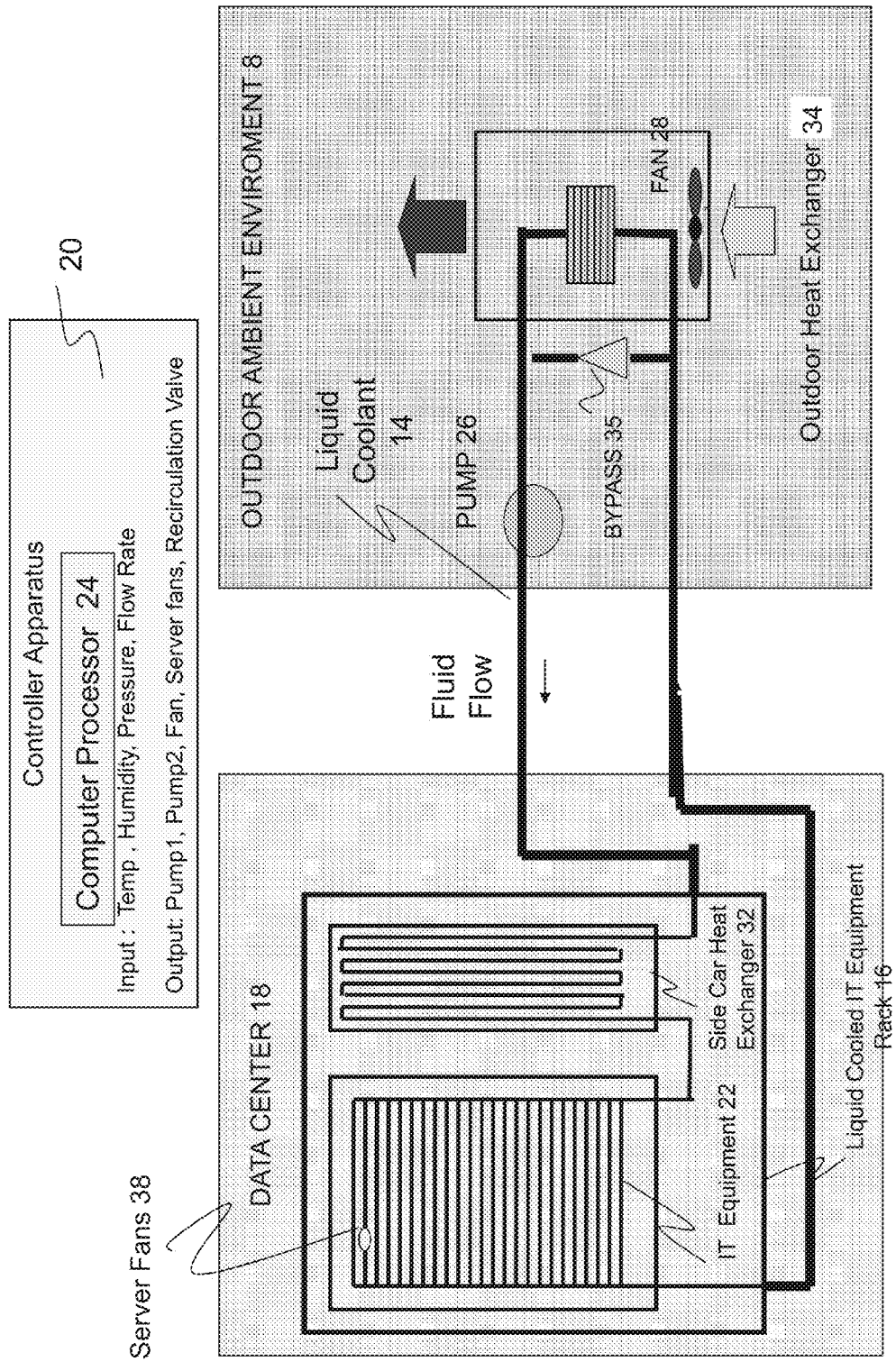
FIG. 17 is a block diagram illustrating a system view of the data center cooling system of FIG. 1.
Figure 18:
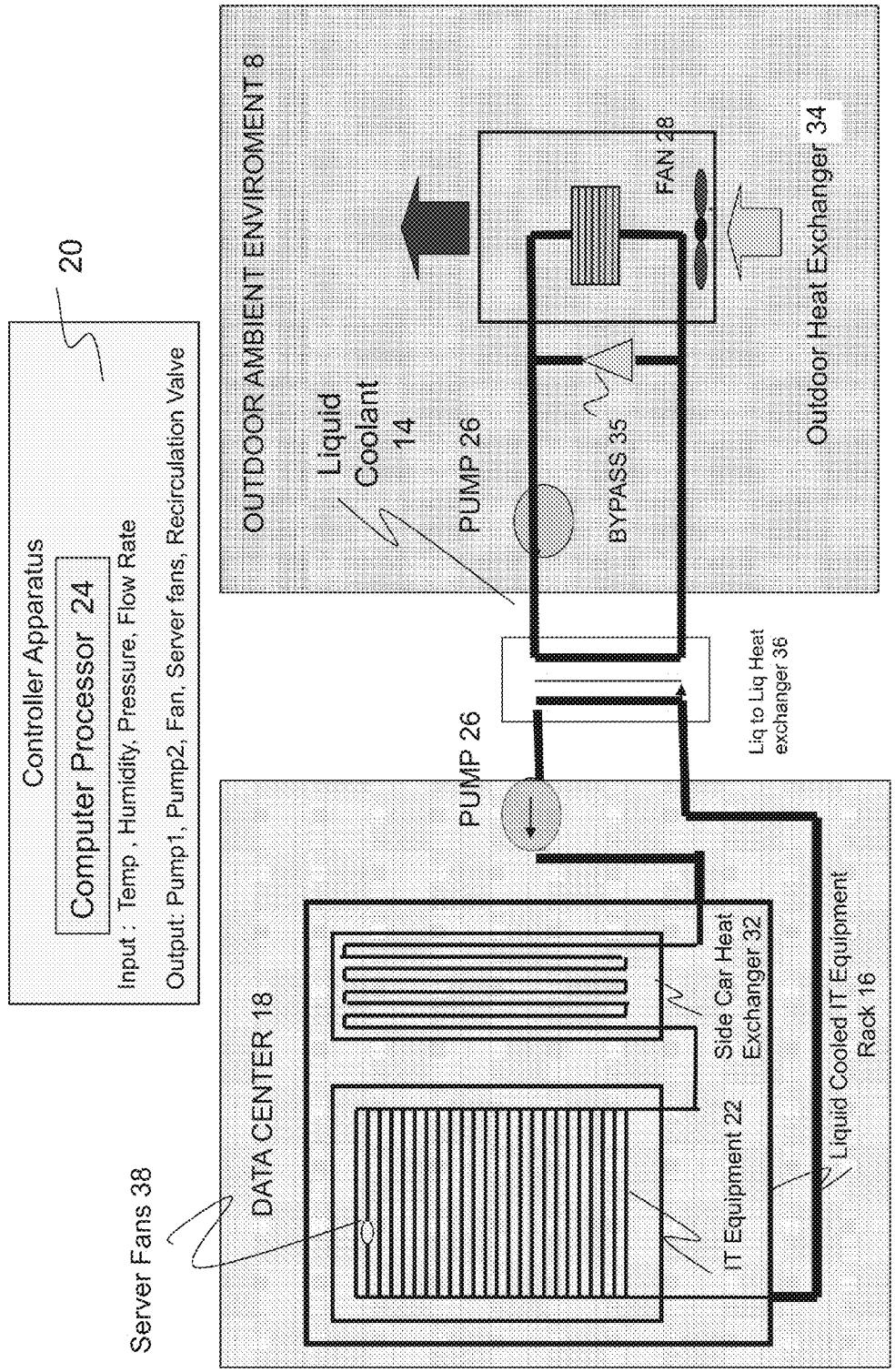
FIG. 18 is a block diagram illustrating a dual loop view of the data center cooling system of FIG. 1.

With reference now to FIGS. 1, 17, and 18, a cooling system 10 is initially described. In an embodiment, the system 10 includes heat transfer equipment 12 to cool a liquid coolant 14 without vapor compression refrigeration, and the liquid coolant is used to cool a liquid cooled information technology equipment rack 16 housed in the data center 18. The system may also include a controller-apparatus 20 to regulate the liquid coolant 14 flow to the liquid cooled information technology equipment rack 16 through a range of liquid coolant flow values based upon information technology equipment 22 temperature thresholds.

In one embodiment, the controller-apparatus 20 comprises a computer processor 24. In another embodiment, the range of liquid coolant flow values provides a continuous heat removal runtime means in which there is no off-on cycling of the system 10. In another embodiment, at least the cooling system pump 26 of the system 10 is not cycled on and off, but rather is continuously powered at varying flow rates dependent on the amount of cooling required.

In one embodiment, the system 10 further includes a cooling system pump 26 and a fan 28 where the controller-apparatus 20 determines the cooling system pump's rpm and the fan's rpm based upon the data center's 18 power consumption and/or information technology equipment 22 operating temperatures. For example, the information technology equipment 22 comprises computers and associated subsystems which is housed within a liquid cooled information technology equipment rack 16.

In one embodiment, the controller-apparatus 20 calculates the cooling system pump 26 rpm and the fan 28 rpm to determine the liquid cooled information technology equipment rack's 16 liquid inlet temperature. In another embodiment, the controller-apparatus 20 ignores the outdoor ambient temperature when calculating the liquid cooled information technology equipment rack's 16 liquid inlet temperature.

In one embodiment, the controller-apparatus 20 regulates the data center's 18 energy usage based upon a user selected upper target temperature and/or a user selected lower target temperature. In another embodiment, the controller-apparatus 20 sets the energy usage to a reduced energy state while maintaining a liquid coolant 14 operating temperature between the user selected upper target temperature and the user selected lower temperature target.

In one embodiment, the controller-apparatus 20 engages additional cooling capacity 30 to limit information technology equipment 22 temperatures to a value at or below the user selected upper target temperature. In another embodiment, the controller-apparatus 20 engages additional cooling capacity 30 while proportionally distributing the additional cooling capacity between a cooling system pump 26 rpm and a fan 28 rpm by means of a bypass valve 35.

In one embodiment, the controller-apparatus 20 reduces cooling capacity to limit information technology equipment 22 temperatures to a value at or above the user selected lower target temperature. In another embodiment, the controller-apparatus 20 powers down information technology equipment 22 when the additional cooling capacity 30 is insufficient.

In one embodiment, the heat transfer equipment 12 includes the liquid cooled information technology equipment rack 16, a side car heat exchanger 32, an outdoor heat exchanger 34, and a liquid to liquid heat exchanger 36, and the controller-apparatus 20 regulates the liquid coolant 14 flow through the liquid cooled information technology equipment rack, the side car heat exchanger, the outdoor heat exchanger, and/or the liquid to liquid heat exchanger by changing the cooling system pump 26 rpm.

In one embodiment, the controller-apparatus 20 bypasses the outdoor heat exchanger 34 to reduce cooling capacity to limit information technology equipment 22 temperatures to a value at or above a user selected lower target temperature. In another embodiment, the controller-apparatus 20 includes the outdoor heat exchanger 34 to add cooling capacity to limit information technology equipment 22 temperatures to a value at or below a user selected upper target temperature.

Figure 2:
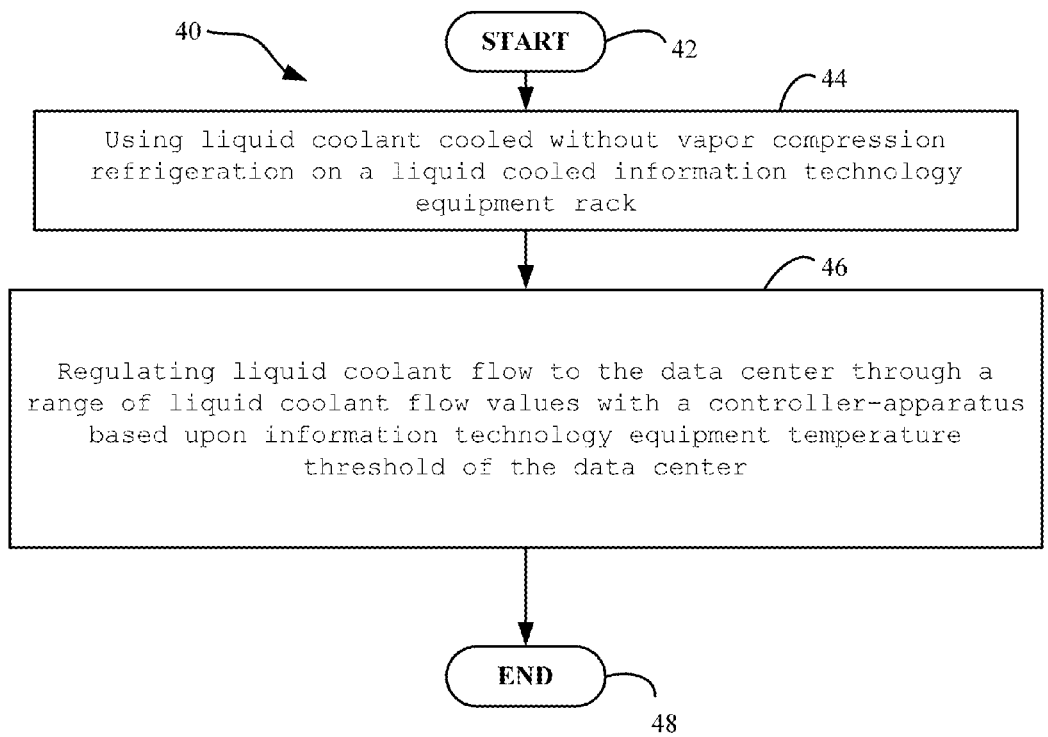
FIG. 2 is a flowchart illustrating method aspects according to various embodiments.

Another aspect is a method for data center cooling, which is now described with reference to flowchart 40 of FIG. 2. The method begins at Block 42 and may include using liquid coolant cooled without vapor compression refrigeration on a liquid cooled information technology equipment rack at Block 44. The method may also include regulating liquid coolant flow to the data center through a range of liquid coolant flow values with a controller-apparatus based upon information technology equipment temperature threshold of the data center at Block 46. The method ends at Block 48.

Figure 3:
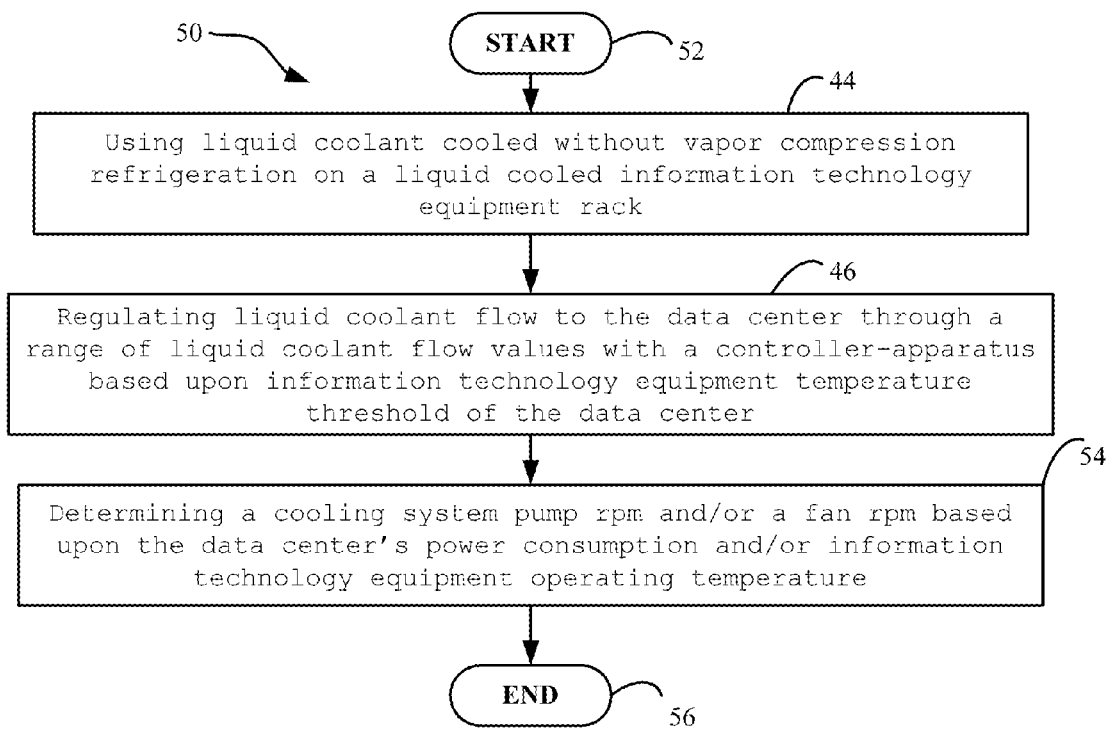
FIG. 3 is a flowchart illustrating method aspects according to the method of FIG. 2.

In another method embodiment, which is now described with reference to flowchart 50 of FIG. 3, the method begins at Block 52. The method may include the steps of FIG. 2 at Blocks 44 and 46. The method may also include determining a cooling system pump rpm and/or a fan rpm based upon the data center's power consumption and/or information technology equipment operating temperature at Block 54. The method ends at Block 56.

Figure 4:
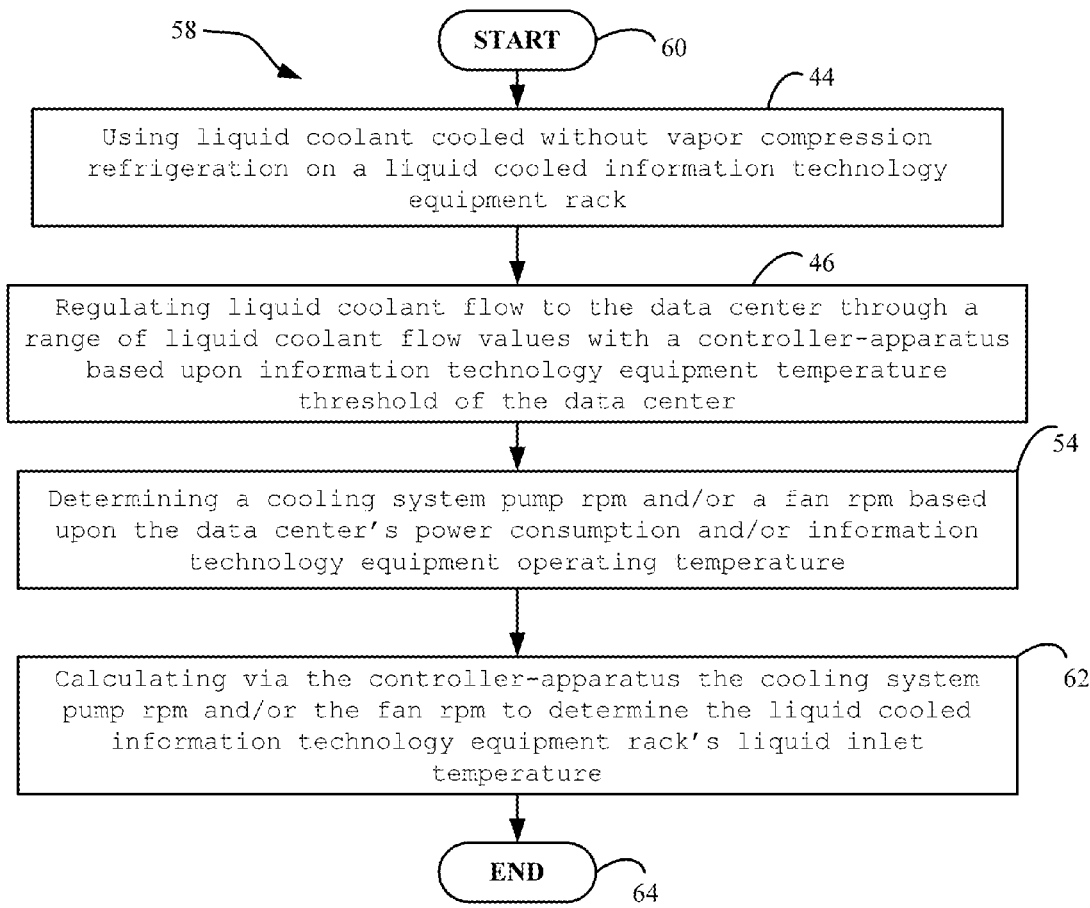
FIG. 4 is a flowchart illustrating method aspects according to the method of FIG. 3.

In another method embodiment, which is now described with reference to flowchart 58 of FIG. 4, the method begins at Block 60. The method may include the steps of FIG. 3 at Blocks 44, 46, and 54. The method may also include calculating via the controller-apparatus the cooling system pump rpm and/or the fan rpm to determine the liquid cooled information technology equipment rack's liquid inlet temperature at Block 62. The method ends at Block 64.

Figure 5:
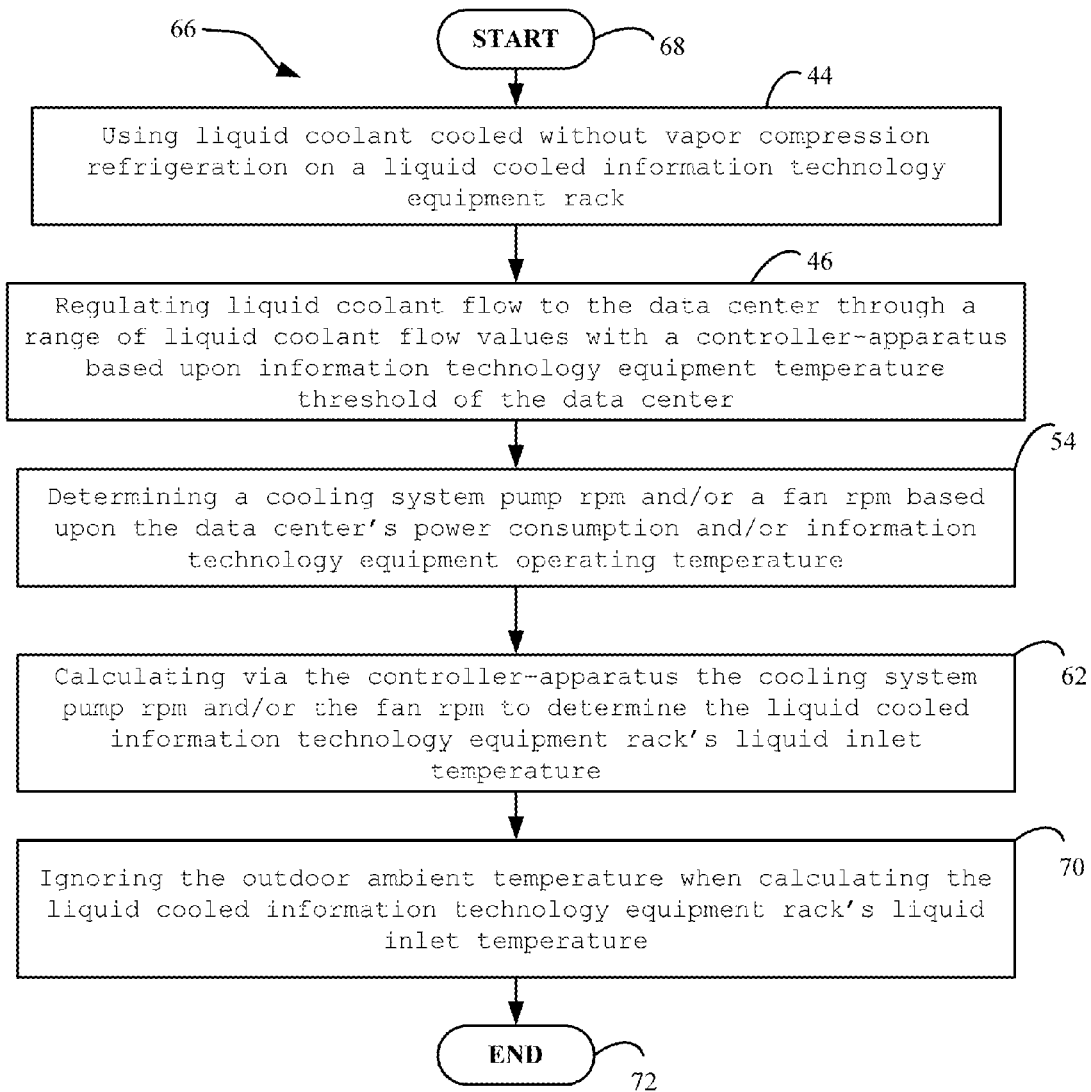
FIG. 5 is a flowchart illustrating method aspects according to the method of FIG. 4.

In another method embodiment, which is now described with reference to flowchart 66 of FIG. 5, the method begins at Block 68. The method may include the steps of FIG. 4 at Blocks 44, 46, 54, and 62. The method may also include ignoring the outdoor ambient temperature when calculating the liquid cooled information technology equipment rack's liquid inlet temperature at Block 70. The method ends at Block 72.

Figure 6:
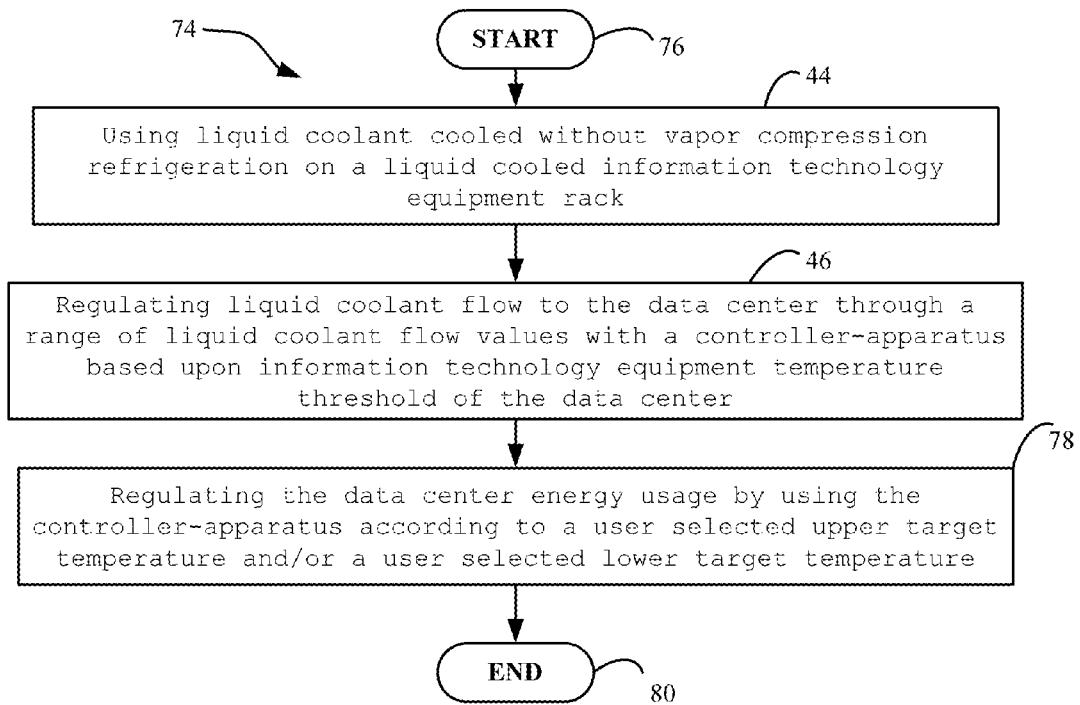
FIG. 6 is a flowchart illustrating method aspects according to the method of FIG. 2.

In another method embodiment, which is now described with reference to flowchart 74 of FIG. 6, the method begins at Block 76. The method may include the steps of FIG. 2 at Blocks 44 and 46. The method may also include regulating the data center energy usage by using the controller-apparatus according to a user selected upper target temperature and/or a user selected lower target temperature at Block 78. The method ends at Block 80.

Figure 7:
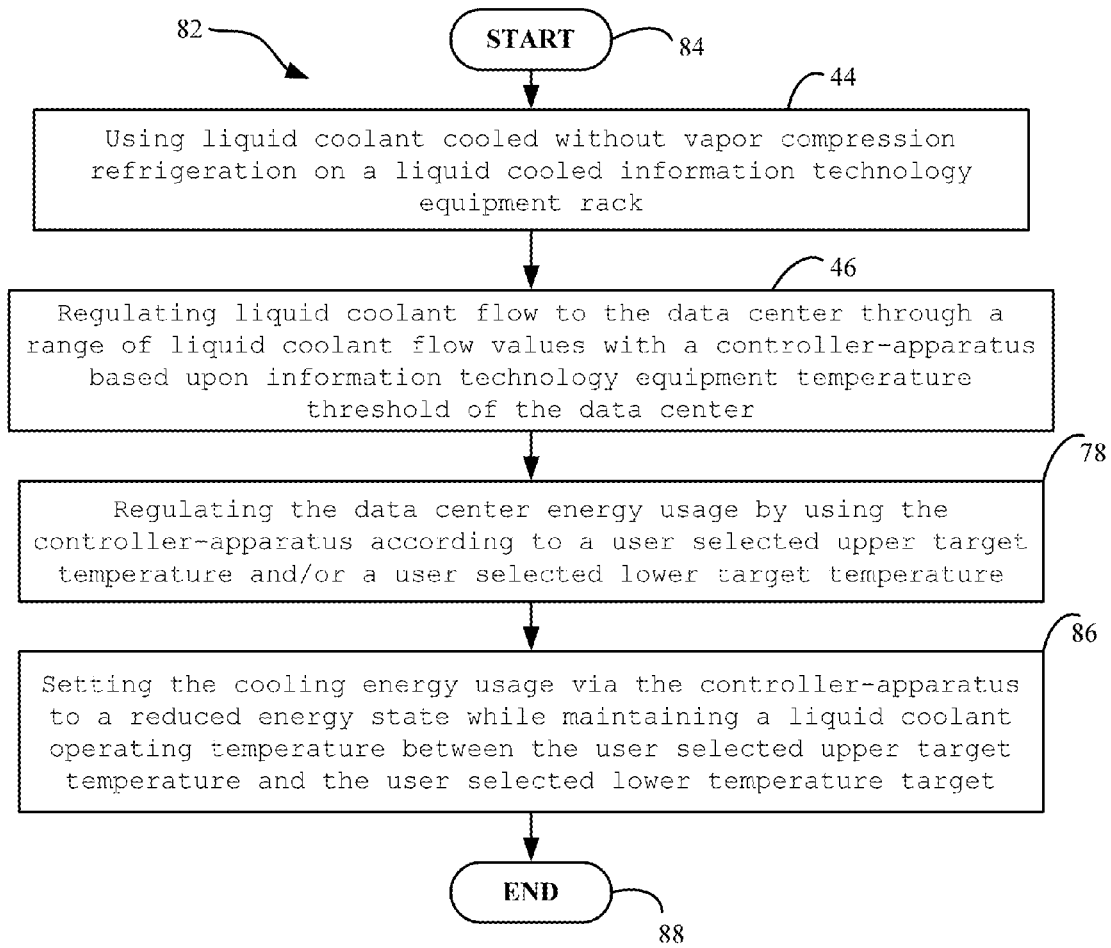
FIG. 7 is a flowchart illustrating method aspects according to the method of FIG. 6.

In another method embodiment, which is now described with reference to flowchart 82 of FIG. 7, the method begins at Block 84. The method may include the steps of FIG. 6 at Blocks 44, 46, and 78. The method may also include setting the cooling energy usage via the controller-apparatus to a reduced energy state while maintaining a liquid coolant operating temperature between the user selected upper target temperature and the user selected lower temperature target at Block 86. The method ends at Block 88.

Figure 8:
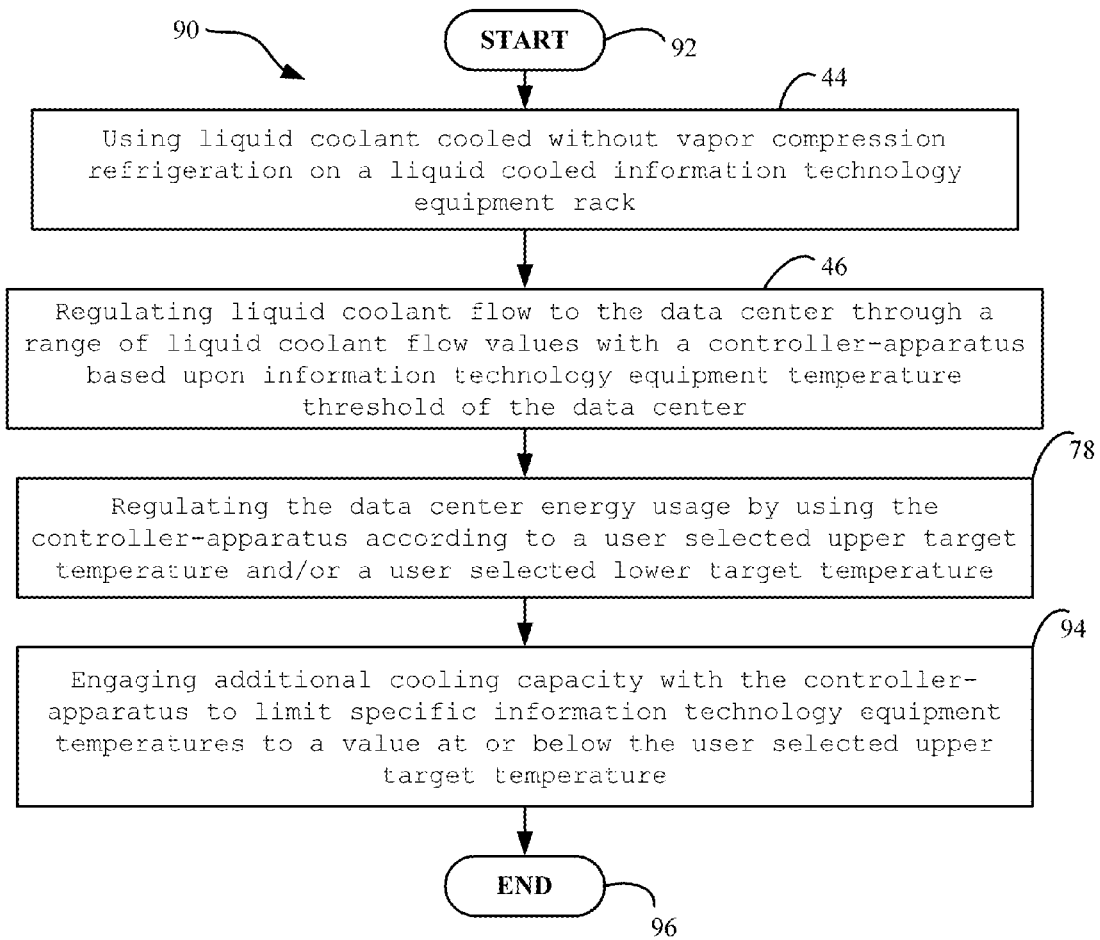
FIG. 8 is a flowchart illustrating method aspects according to the method of FIG. 6.

In another method embodiment, which is now described with reference to flowchart 90 of FIG. 8, the method begins at Block 92. The method may include the steps of FIG. 6 at Blocks 44, 46, and 78. The method may also include engaging additional cooling capacity with the controller-apparatus to limit specific information technology equipment temperatures to a value at or below the user selected upper target temperature at Block 94. The method ends at Block 96.

Figure 9:
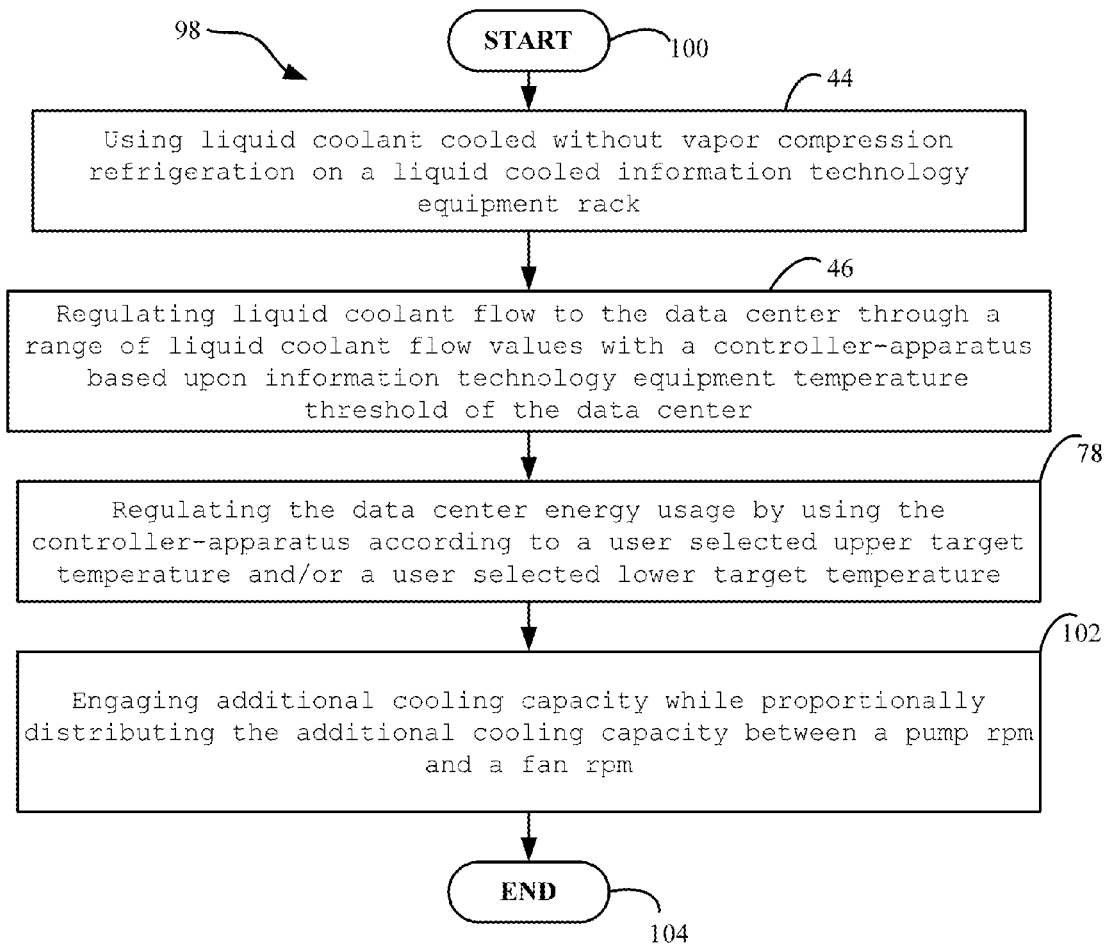
FIG. 9 is a flowchart illustrating method aspects according to the method of FIG. 6.

In another method embodiment, which is now described with reference to flowchart 98 of FIG. 9, the method begins at Block 100. The method may include the steps of FIG. 6 at Blocks 44, 46, and 78. The method may also include engaging additional cooling capacity while proportionally distributing the additional cooling capacity between a pump rpm and a fan rpm at Block 102. The method ends at Block 104.

Figure 10:
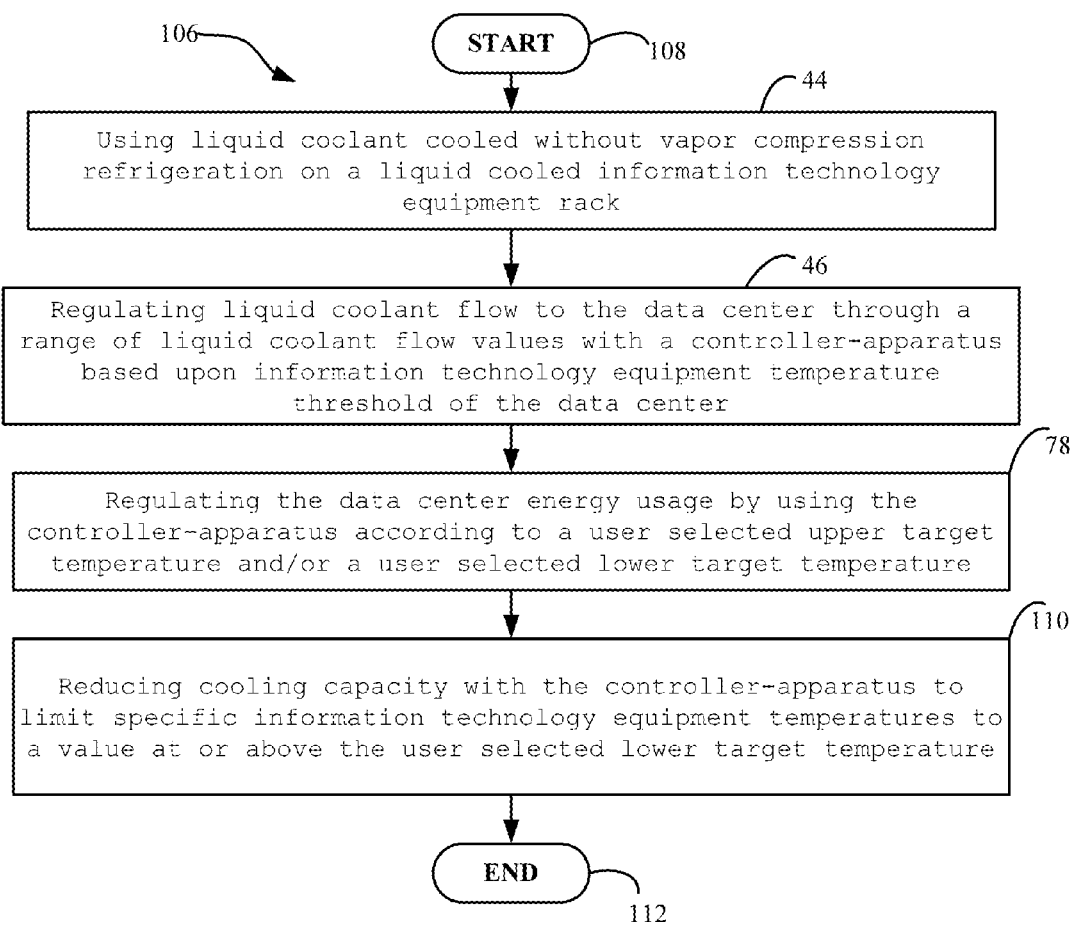
FIG. 10 is a flowchart illustrating method aspects according to the method of FIG. 6.

In another method embodiment, which is now described with reference to flowchart 106 of FIG. 10, the method begins at Block 108. The method may include the steps of FIG. 6 at Blocks 44, 46, and 78. The method may also include reducing cooling capacity with the controller-apparatus to limit specific information technology equipment temperatures to a value at or above the user selected lower target temperature at Block 110. The method ends at Block 112.

Figure 11:
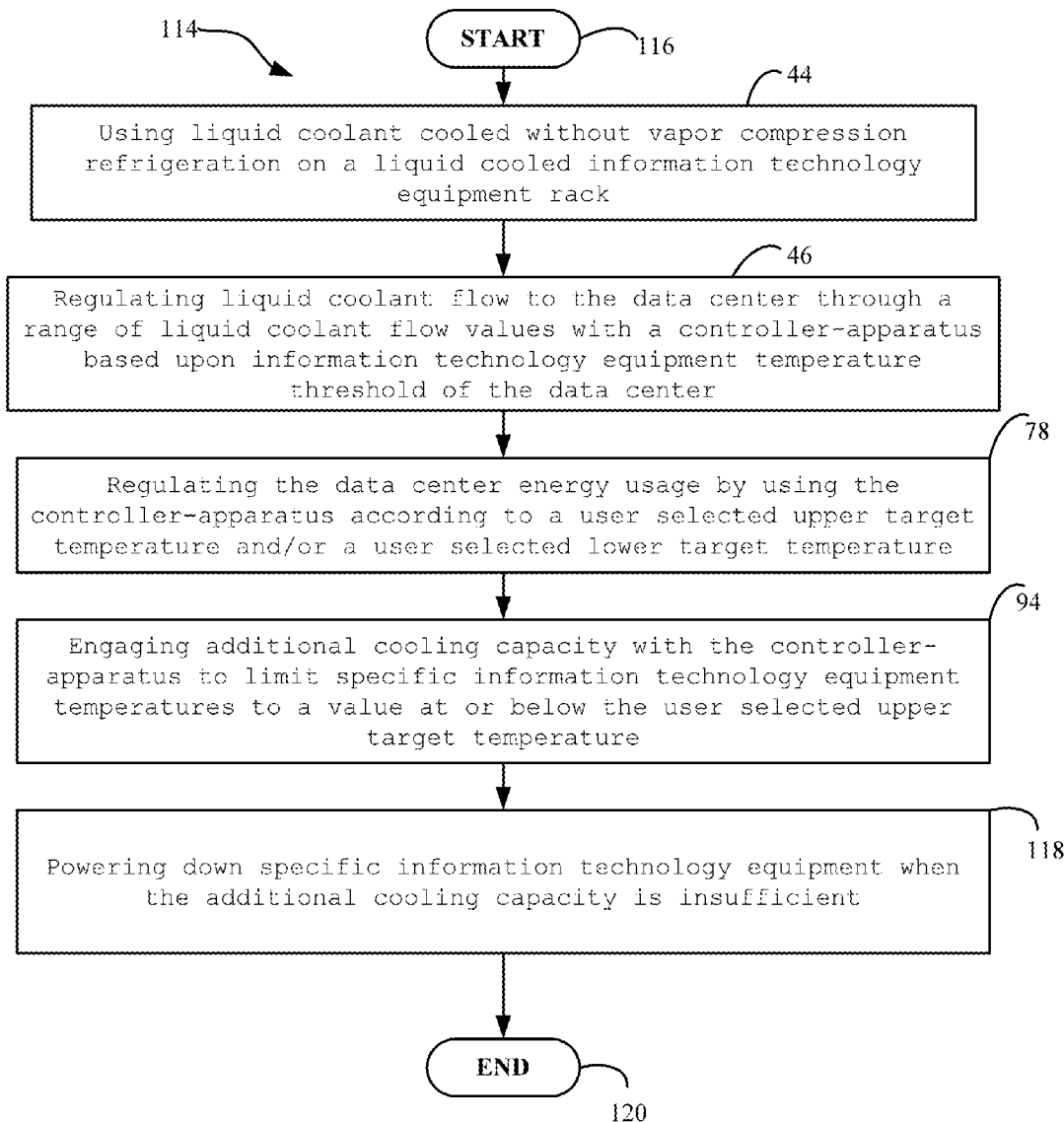
FIG. 11 is a flowchart illustrating method aspects according to the method of FIG. 8.

In another method embodiment, which is now described with reference to flowchart 114 of FIG. 11, the method begins at Block 116. The method may include the steps of FIG. 8 at Blocks 44, 46, 78, and 94. The method may also include powering down specific information technology equipment when the additional cooling capacity is insufficient at Block 118. The method ends at Block 120.

Figure 12:
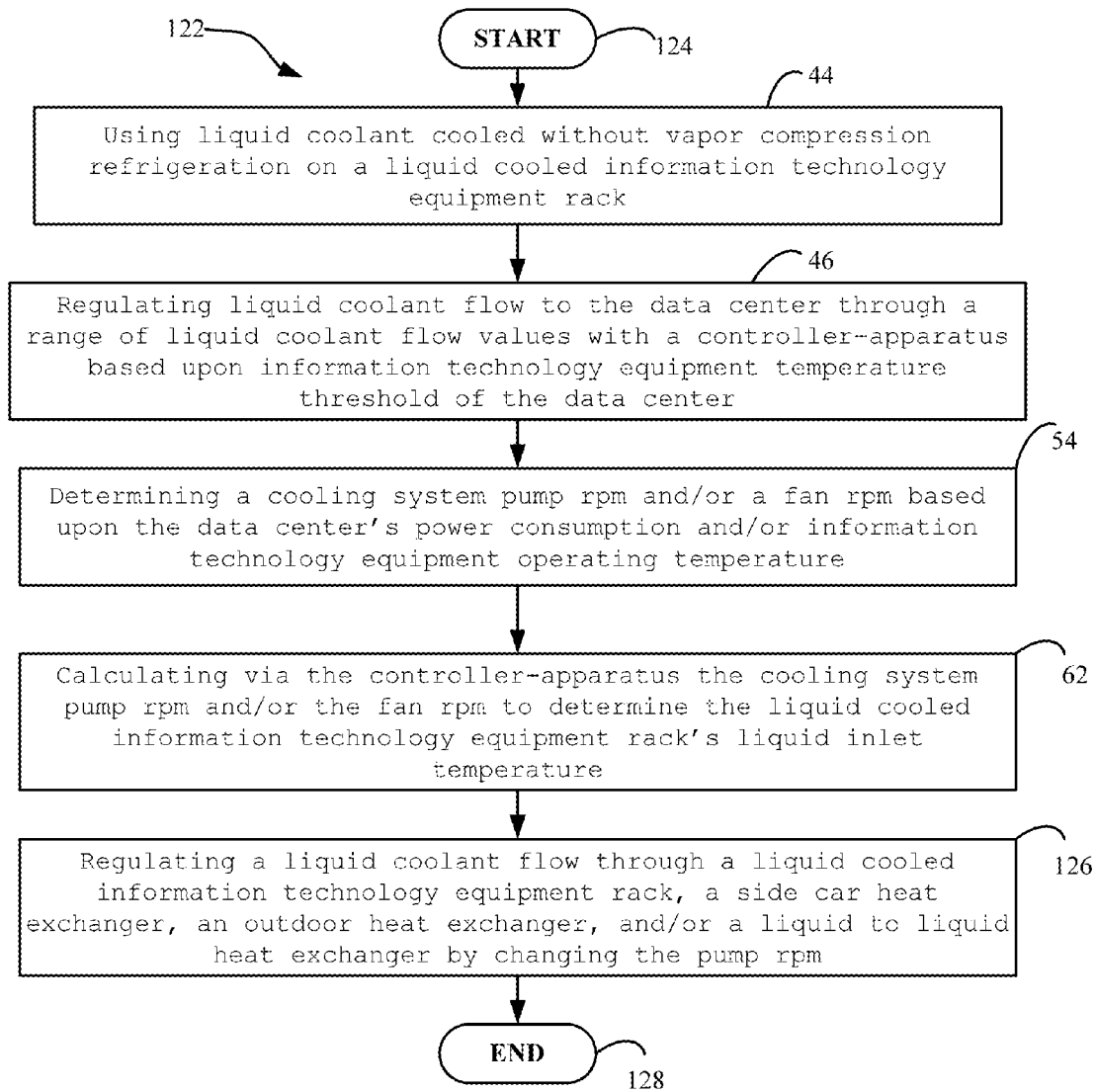
FIG. 12 is a flowchart illustrating method aspects according to the method of FIG. 4.

In another method embodiment, which is now described with reference to flowchart 122 of FIG. 12, the method begins at Block 124. The method may include the steps of FIG. 4 at Blocks 44, 46, 54, and 62. The method may also include regulating a liquid coolant flow through a liquid cooled information technology equipment rack, a side car heat exchanger, an outdoor heat exchanger, and/or a liquid to liquid heat exchanger by changing the pump rpm at Block 126. The method ends at Block 128.

Figure 13:
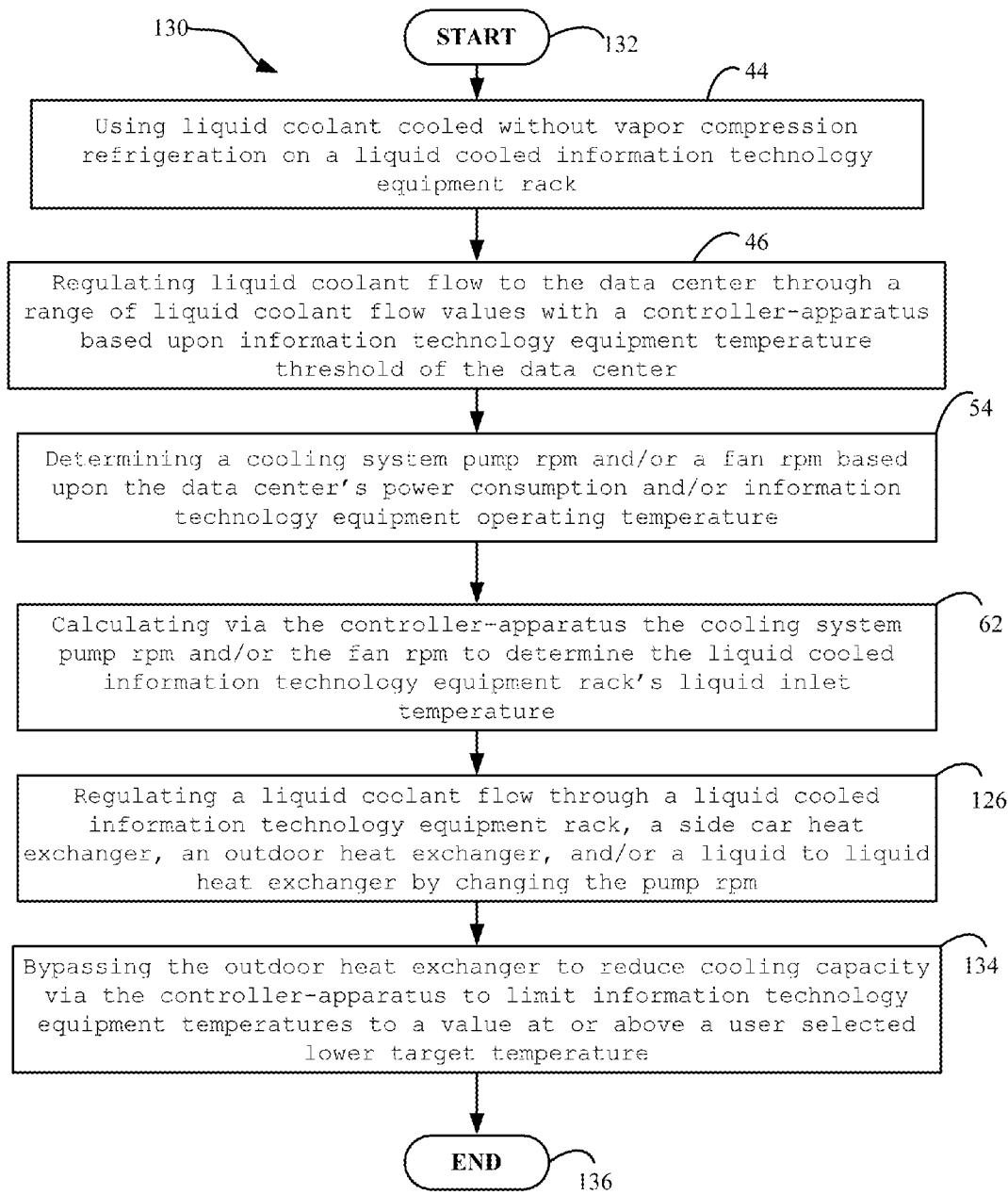
FIG. 13 is a flowchart illustrating method aspects according to the method of FIG. 12.

In another method embodiment, which is now described with reference to flowchart 130 of FIG. 13, the method begins at Block 132. The method may include the steps of FIG. 12 at Blocks 44, 46, 54, 62, and 126. The method may also include bypassing the outdoor heat exchanger to reduce cooling capacity via the controller-apparatus to limit information technology equipment temperatures to a value at or above a user selected lower target temperature at Block 134. The method ends at Block 136.

Figure 14:
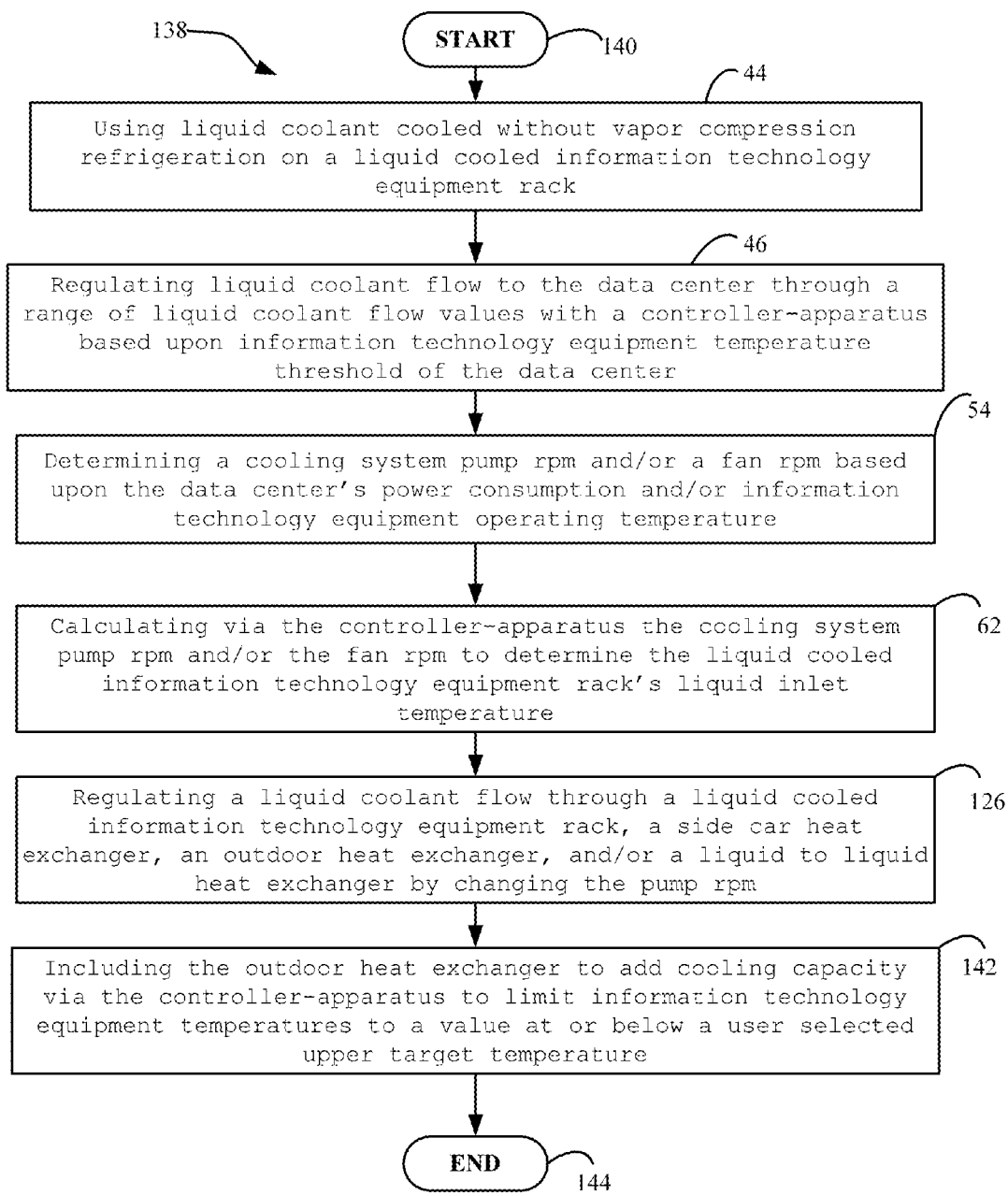
FIG. 14 is a flowchart illustrating method aspects according to the method of FIG. 12.

In another method embodiment, which is now described with reference to flowchart 138 of FIG. 14, the method begins at Block 140. The method may include the steps of FIG. 12 at Blocks 44, 46, 54, 62, and 126. The method may also comprise including the outdoor heat exchanger to add cooling capacity via the controller-apparatus to limit information technology equipment temperatures to a value at or below a user selected upper target temperature at Block 142. The method ends at Block 144.

Figure 15:
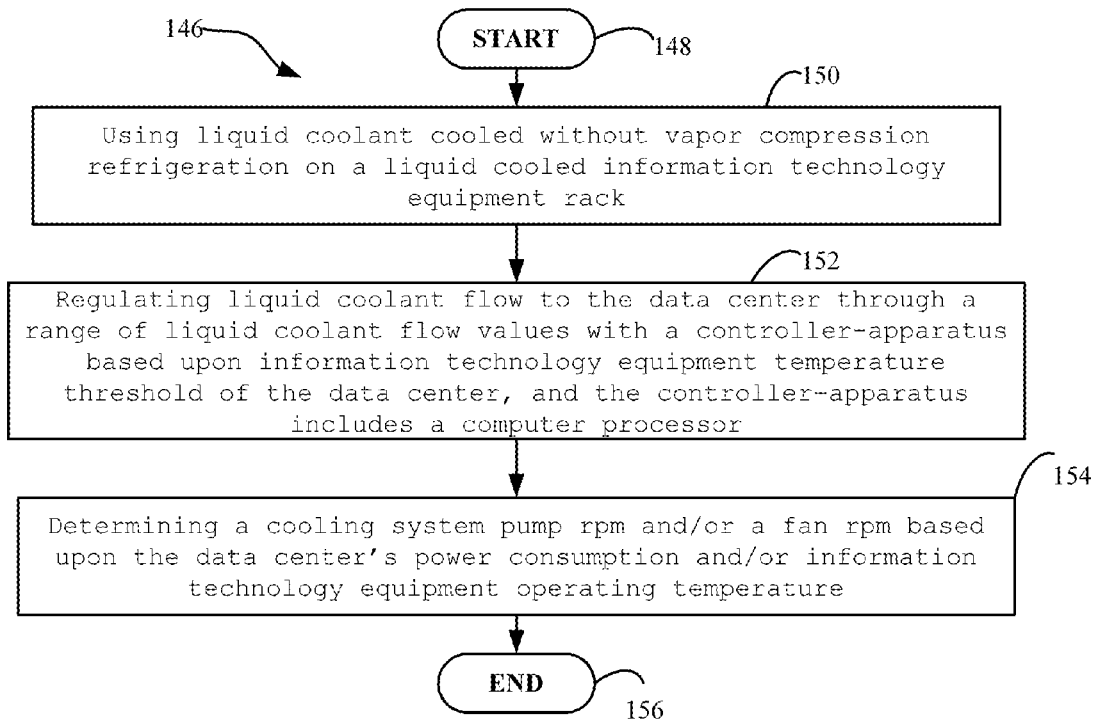
FIG. 15 is a flowchart illustrating method aspects according to various embodiments.

Another aspect is a method for data center cooling, which is now described with reference to flowchart 146 of FIG. 15. The method begins at Block 148 and may include using liquid coolant cooled without vapor compression refrigeration on a liquid cooled information technology equipment rack at Block 150. The method may also include regulating liquid coolant flow to the data center through a range of liquid coolant flow values with a controller-apparatus based upon information technology equipment temperature threshold of the data center, and the controller-apparatus includes a computer processor at Block 152. The method may further include determining a cooling system pump rpm and/or a fan rpm based upon the data center's power consumption and/or information technology equipment operating temperature at Block 154. The method ends at Block 156.

Figure 16:
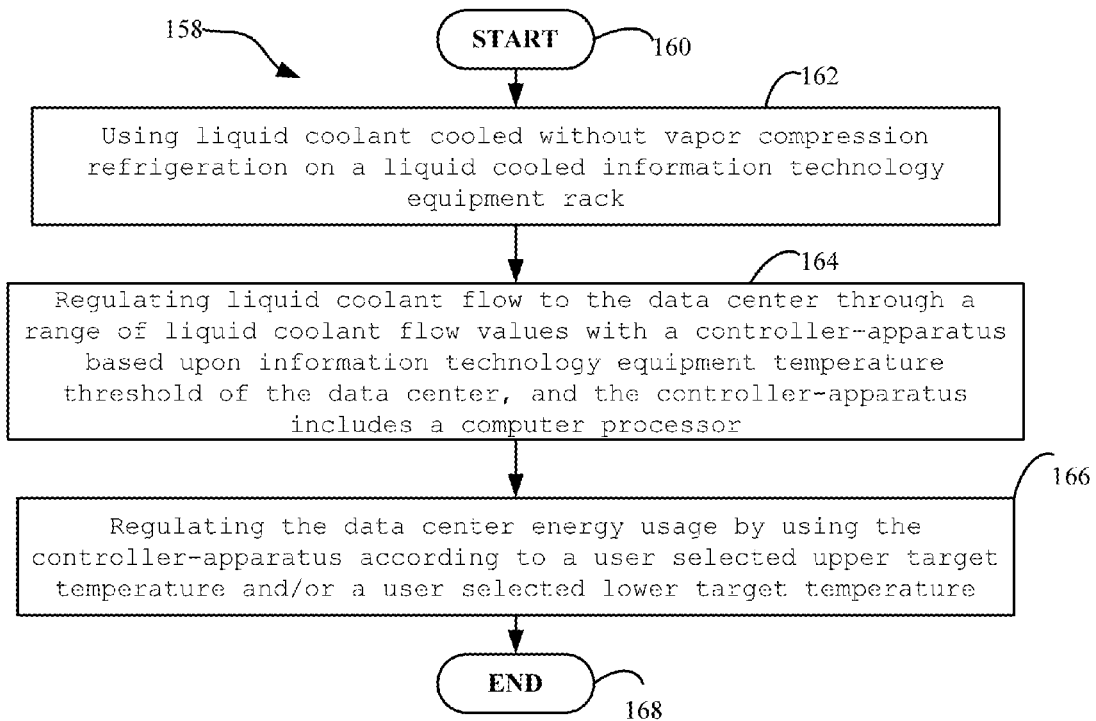
FIG. 16 is a flowchart illustrating method aspects according to various embodiments.

Another aspect is a method for data center cooling, which is now described with reference to flowchart 158 of FIG. 16. The method begins at Block 160 and may include using liquid coolant cooled without vapor compression refrigeration on a liquid cooled information technology equipment rack at Block 162. The method may also include regulating liquid coolant flow to the data center through a range of liquid coolant flow values with a controller-apparatus based upon information technology equipment temperature threshold of the data center, and the controller-apparatus includes a computer processor at Block 164. The method may further include regulating the data center energy usage by using the controller-apparatus according to a user selected upper target temperature and/or a user selected lower target temperature at Block 166. The method ends at Block 168.

In view of the foregoing, the system 10 provides cooling for the data center. For example, system 10 uses a set of temperature-based proportional servo control algorithms, for a fluid, e.g. liquid coolant 14, cooled chiller-less data center 18, that is implemented to reduce the data center cooling power consumption while controlling to a specified temperature. The specified temperature could be the liquid coolant 14 temperature entering the liquid cooled information technology equipment rack 16 of servers, e.g. information technology equipment 22.

Figure 19:
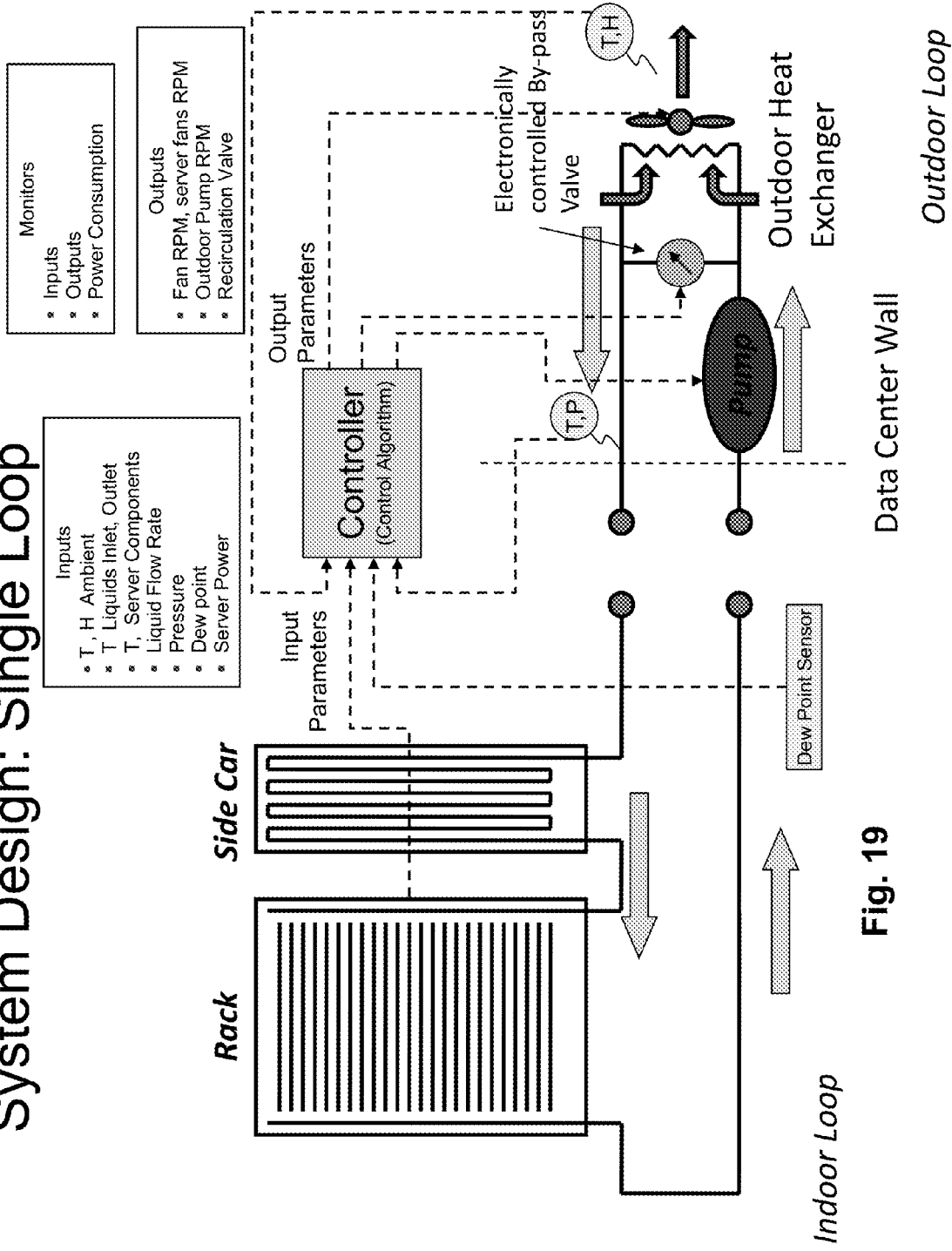
FIG. 19 illustrates an exemplary single loop improved data center cooling system in accordance with various embodiments.
Figure 20:
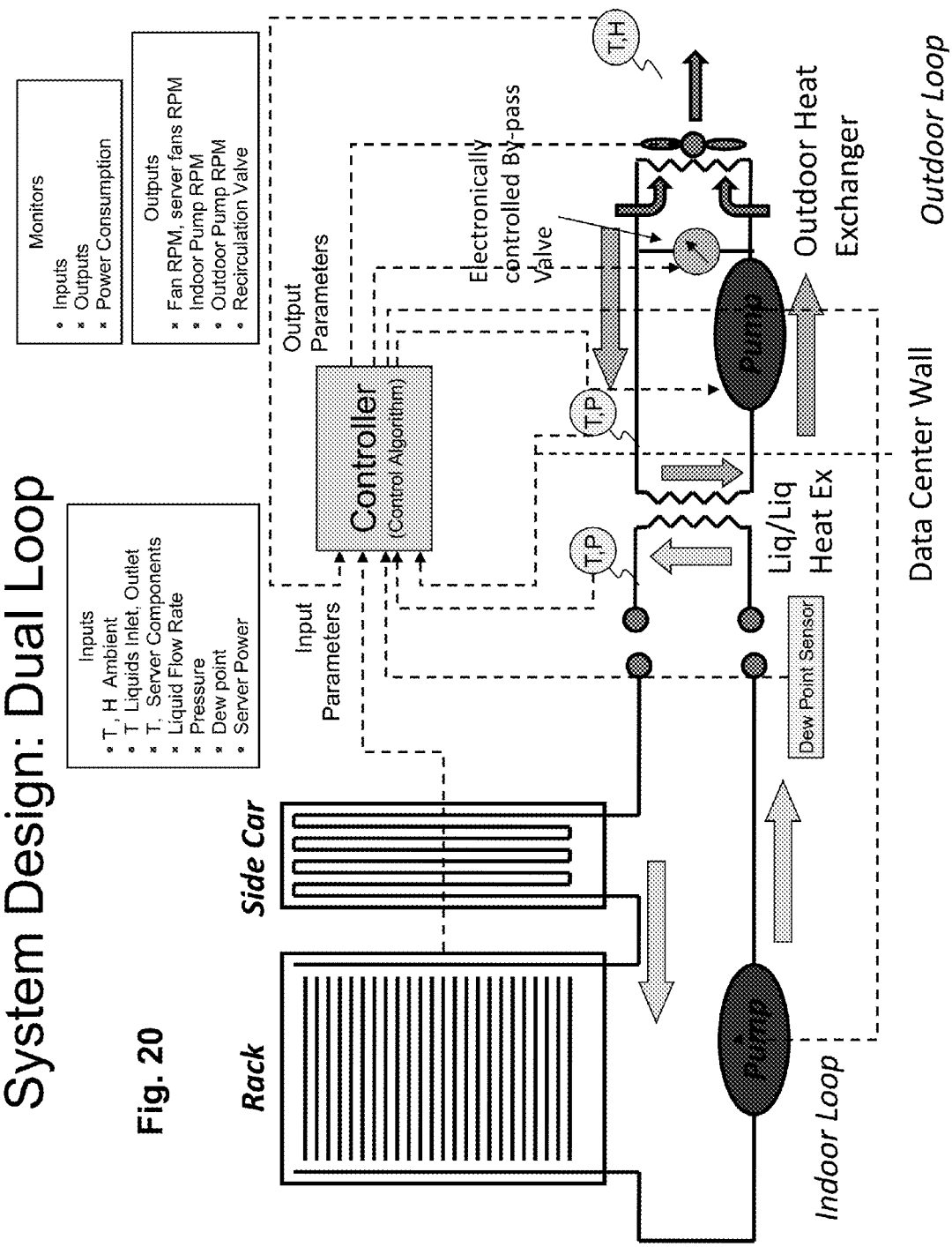
FIG. 20 illustrates an exemplary dual loop improved data center cooling system in accordance with various embodiments.

In an embodiment, system 10 includes a liquid cooled chiller-less data center 18 cooling system that comprises liquid cooled information technology equipment rack 16, e.g. electronics rack(s), which is liquid cooled, side-car(s) air to liquid heat exchanger(s) 32, and optional liquid-to-liquid heat exchanger(s) 36 (FIGS. 19 and 20). The heat dissipated by the electronics components, e.g. information technology equipment 22, within the rack(s) 16 is transferred to the liquid coolant 14—partially by direct thermal conduction using CPU Cold Plates and DIMM spreaders attached to liquid cooled cold rails within the servers and partially by air to liquid heat exchange in which air flowing over server components extracts heat from the components which is rejected to the side car(s) 32. This heat is then transported to the outdoor heat exchanger 34 where it is dissipated to the ambient air environment 8.

The rate of heat transfer at the rack(s) 16 and the side car(s) 32 is governed by the liquid coolant 14 flow rate through them and air flow rate over the server components and side car heat exchanger within the rack 16. The air flow rate is determined by the rpm of the bank of fans within each server as shown in FIG. 21C and/or optionally could be an external fan within the rack 16. At the outdoor heat exchanger 34, the heat transfer rate is governed by the outdoor heat exchanger air-side flow rate and the liquid coolant 14 flow rate through the outdoor heat exchanger. The heat transfer rate is a non-linear monotonically increasing function of air-side flow rate and liquid coolant 14 flow rate.

In an embodiment, for any given outdoor heat exchanger 34 design there is a limit to the air-side flow rate and liquid coolant 14 flow rate. These limits are used to guide the outdoor heat exchanger 34 selection so as to meet the upper cooling requirements (worst case scenario) by a safe margin. Worst case scenario here refers to highest ambient air temperature and highest heat dissipation at the rack(s) 16, and in a more general sense, highest heat dissipation at the data center 18, occurring simultaneously. A worst case scenario which exceeds the cooling capability at the highest heat dissipation may never occur over the life cycle for a system designed with a safety margin.

A control algorithm, executing on the controller-apparatus 20, based on data center 18 heat dissipation and on ambient air temperature, is used to properly improve the cooling power consumption and further reduce the data center energy usage. Also, in certain conditions where the outdoor air temperature is significantly high, it becomes important to maintain the liquid coolant 14 temperature going to the liquid cooled information technology equipment rack 16 below a certain threshold to ensure proper functioning of the IT equipment 22.

System 10 uses a set of temperature-based servo control algorithms, for a liquid cooled chiller-less data center 18 that can be implemented to reduce the data center cooling power consumption while controlling to a specified temperature under varying temperature and workload conditions. In one exemplary embodiment the specified temperature could be the liquid coolant 14 temperature entering the rack 16 of servers 22.

Figure 22:
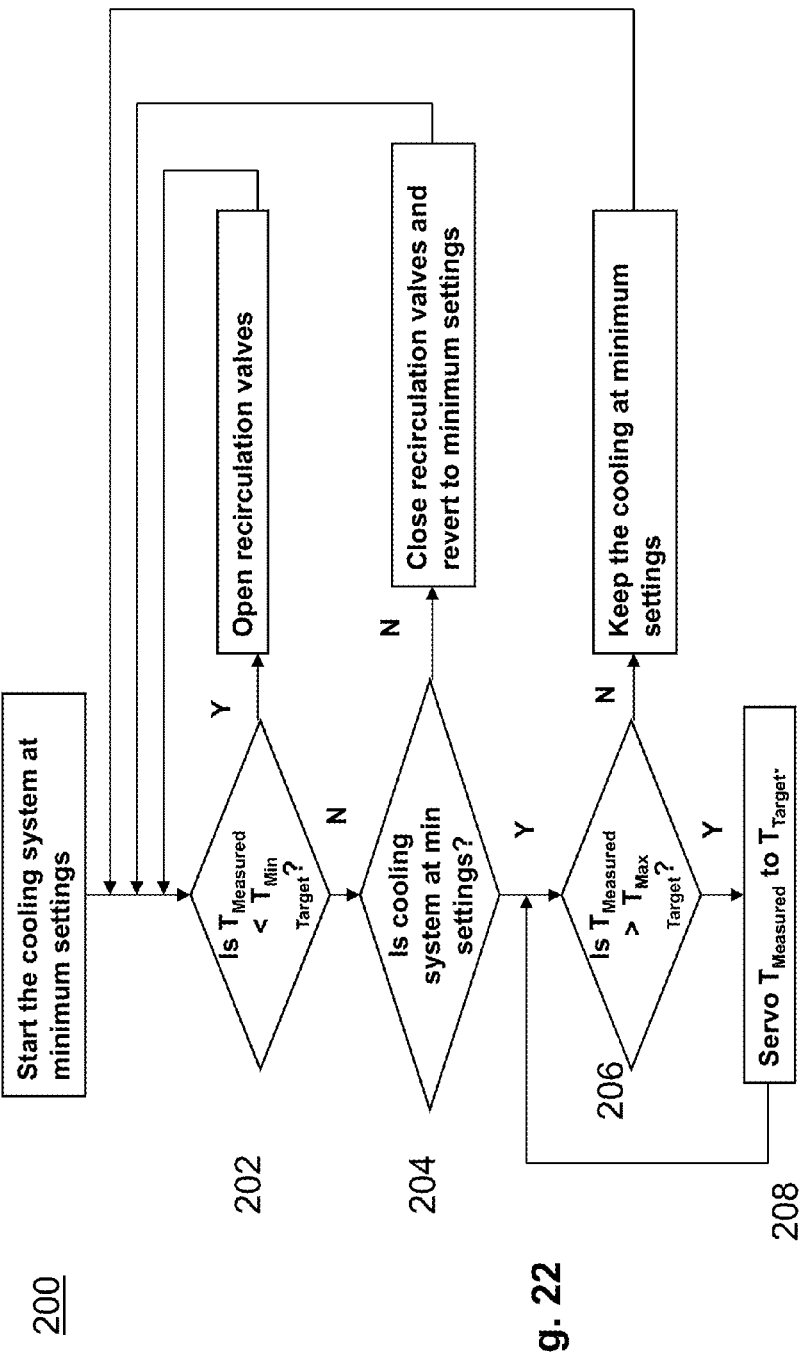
FIG. 22 is a flowchart illustrating method aspects according to various embodiments.
Figure 23:
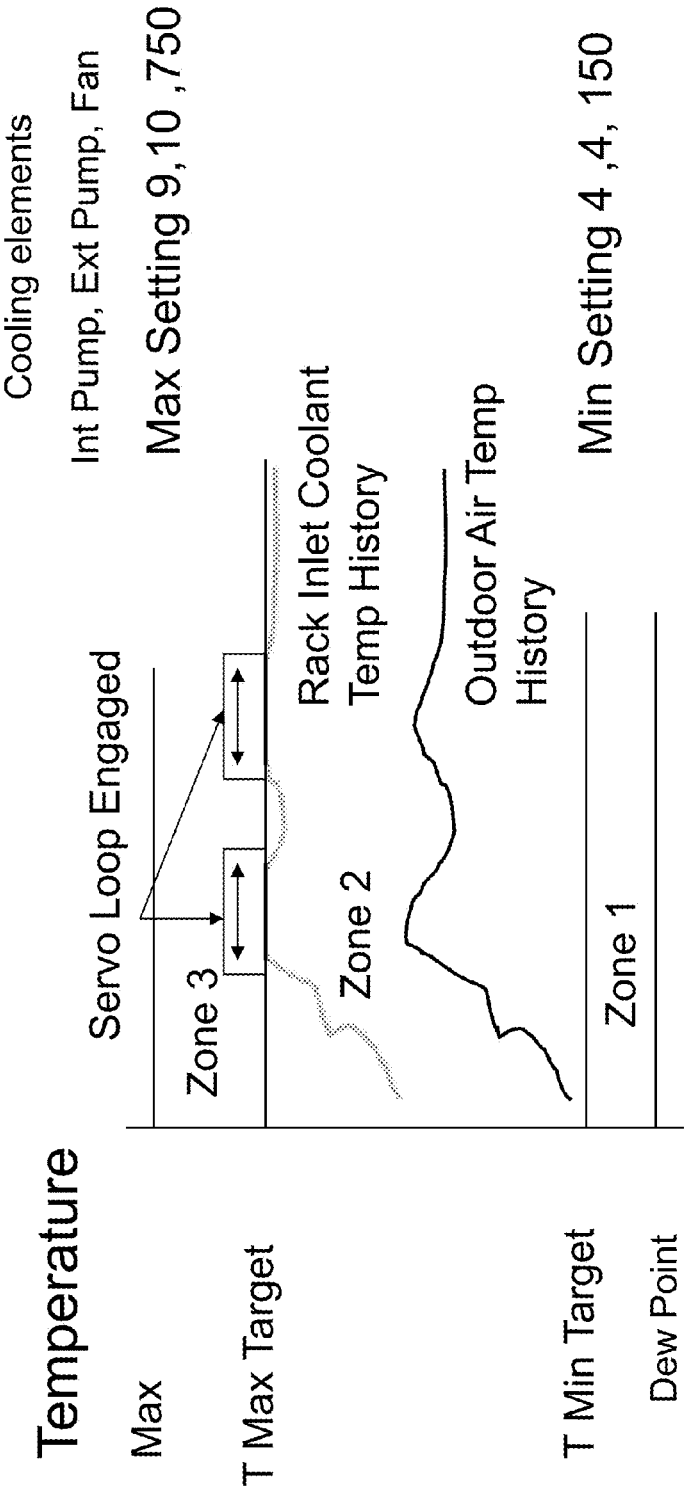
FIG. 23 illustrates an exemplary rack inlet coolant temperature using servo control aspects according to various embodiments.

An embodiment is shown in FIGS. 22 and 23 in which the system operates at a specified lower, e.g. minimum, cooling power setting as long as the temperature being controlled, (T_Measured) is between a Minimum Temperature Target and a Maximum Temperature Target. For example, the rack 16 inlet coolant temperature could be controlled between a Max target and Min target for any given outdoor weather condition and IT Equipment 22 power and/or workload.

As shown in flow diagram of FIG. 22, the cooling system 10 is started at a specified lower or minimum cooling power setting. This minimum setting need not be the global minimum for the cooling system 10, but rather a user selectable input.

If in element 202 T Measured approaches the T min target the system 10 goes into a winter mode operation and begins to open a recirculation valve to maintain the system above the dew point. If in element 204 the T Measured increases above the T min target, the cooling system 10 begins to close the recirculation valves.

In element 206, T Measured is compared to the T max target and if T_Measured is below the T max target temperature, the cooling system 10 operates at its lower or minimum cooling power setting.

If T_Measured is above the T max target, the servo loop 208 is engaged to control the cooling elements to servo T_Measured close to the Target temperature. For example, the external loop pump flow rate and the outdoor heat exchanger 34 fans 28 speed could be changed proportionately to keep T_Measured close to the Target temperature.

This approach provides three distinct zones of control: 1) Below T min target—In this zone, the system 10 responds to keep the temperature above the dew point; 2) Above T min target and Below T max target—The system 10 operates in an energy efficient cooling mode to reduce the cooling power; 3) Above T max target—The system 10 servo is initiated to control the cooling elements to maintain a T max target.

The system 10 could be implemented in a number of ways. One way is to program the control algorithm onto the programmable logic controller (PLC) unit, e.g. controller-apparatus 20, controlling the outdoor heat exchanger 34 fans 28 and liquid coolant pumps 26 operation. Another way is to run the control algorithm on a remote computer that takes in the required input information from the data center 18 and outputs an improved solution to the cooling system 10.

FIGS. 19 and 20 represents two liquid cooled chiller-less data center 18 cooling designs and schematic of a typical volume server node. FIG. 19 represents a single loop configuration that consists of liquid cooled rack(s) 16, side car(s) 32, outdoor heat exchanger(s) 34, electronically controlled by-pass/recirculation valve(s) and controller(s) 20 used to implement the control algorithms.

For the single loop configuration of FIG. 19, the inputs to the controller 20 could be ambient temperature, humidity, and/or the like, coolant inlet, outlet temperatures, and/or the like, room dew point temperature, temperature of server components, e.g., central processing unit (CPU), dual inline memory modules (DIMMs), hard-drives, and/or the like, coolant flow rate, air flow rate (outside), air flow rate (rack), and/or the like, and server power. The outputs of the controller 20 could be the outdoor Fan 28 RPM, Server Fan(s) 38, Pump 26 RPM, recirculation valve (percent open), and/or the like.

FIG. 20 represents a dual loop configuration which consists of liquid cooled rack(s) 16, side car(s) 32, liquid-to-liquid heat exchanger(s) 36, outdoor heat exchanger(s) 34, electronically controlled by-pass/recirculation valve(s), and controller(s) 20 used to implement the control algorithms. For the dual loop configuration, the inputs to the controller 20 could be ambient temperature, humidity, and/or the like, indoor loop coolant inlet and outlet temperatures, outdoor loop coolant temperature, room dew point temperature, temperature of server components such as CPU, DIMMs, hard-drives, and/or the like, coolant flow 14 rate, air flow rate (outside), air flow rate (rack), and server 22 power. The outputs of the controller 20 could be the outdoor Fan 28 RPM, Server Fan(s) 38, outdoor Pump 26 RPM, Indoor Pump 26 RPM, recirculation valve (percent open), and/or the like.

The configurations shown in FIGS. 19 and 20 can be generalized to having up to I number of fans 28, J number of server fans 38, and K number of liquid coolant pumps 26. So, in a more general sense, the RPM of I number of outdoor heat exchanger 34 fans and K number of liquid (where I, J, and K are integers) coolant pumps 26 can be regulated individually or simultaneously to reduce/improve the data cooling energy and can subsequently reduce the total data center 18 energy consumption while controlling to a specified temperature.

Figure 21:
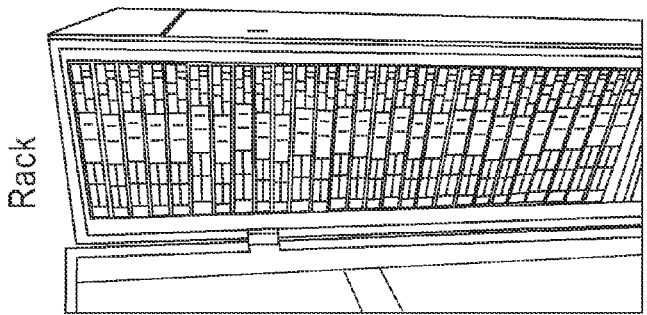
FIG. 21 illustrates exemplary controller input parameters from a rack in accordance with various embodiments.
Figure 21:
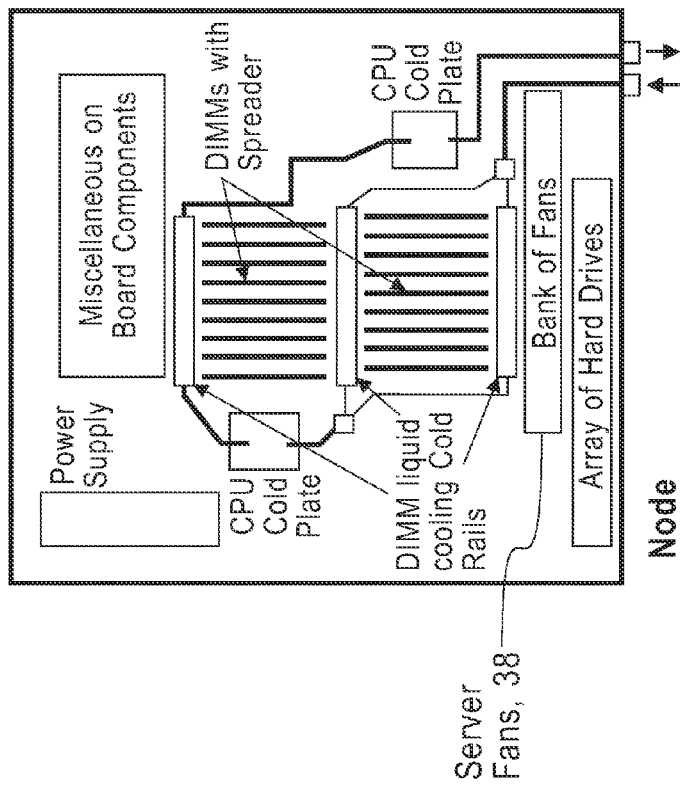

FIG. 21 illustrates a typical volume server rack 16 and a schematic of a partially liquid cooled and partially air cooled volume server node. The inputs from the rack 16 may include air temperature entering each node in each rack, each and every operational CPU's temperature or platform environment control interface (PECI), each and every DIMM temperature, hard-drives temperatures and temperature of any other key components. The controller 20 may also monitor all the inputs, all the outputs, power consumption by all the various components (data center 18 as well as facility side).

The heat dissipated by the electronic rack(s) 16 is transfer to the liquid coolant—partially by direct thermal conduction using CPU Cold Plates and DIMM spreaders attached to liquid cooled cold rails within the server(s) and partially by air to liquid heat exchange in which air flowing over server components extracts heat from the components which is rejected to the side car(s) 32. In case of a single loop design, the heat is then transported to the outdoor heat exchanger(s) 34 where it is dissipated to the ambient air.

In case of a dual loop, the heat is first transferred from the inner coolant loop to the outer coolant loop via liquid-to-liquid heat exchanger(s) 36 and is then transported to the outdoor heat exchanger(s) 34 where it is dissipated to the ambient air. The rate of heat transfer at the rack(s) 16 and the side car(s) 32 is governed by the liquid coolant flow rate through them and air flow rate over the server components and side car heat exchanger within the rack 16.

FIG. 23 shows an expected temperature history when this control is implemented for rack 16 inlet coolant temperature servo control. The upper design specification on the rack 16 inlet coolant temperature could be 40 C. So a target temperature of, say 38 C, can be selected. The lower settings could be specified to be 6 gpm internal loop flow rate, 4 gpm external loop flow rate, 150 rpm outdoor heat exchanger 34 fans speed, server fans speed of 5000 rpm and recirculation valves fully closed. The maximum settings could be specified to be 6 gpm internal loop flow rate, 10 gpm external loop flow rate, 750 rpm outdoor heat exchanger 34 fans speed, server fan speeds of 15000 rpm, and recirculation valves fully closed.

If the T_Measured goes above the Target temperature (38 C), the external loop pump flow rate and the outdoor heat exchanger 34 fans speed could be changed proportionately between the specified minimum and maximum setting to keep T_Measured close to the Target temperature. If the T_Measured is in between the minimum temperature target and the maximum temperature target, T_Measured is allowed to drift and the cooling system operates at the specified minimum setting.

Figure 24:
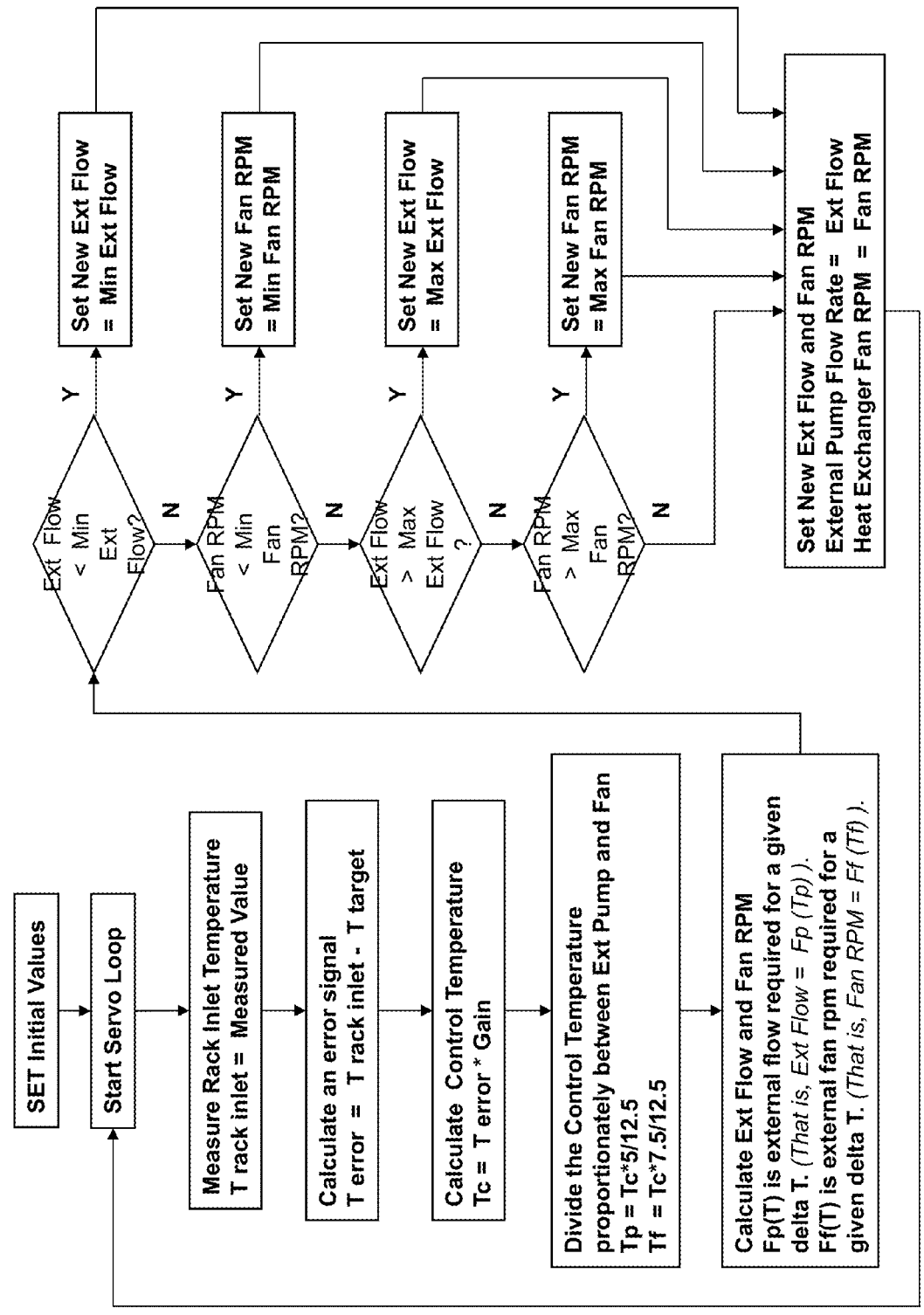
FIG. 24 is a flowchart illustrating method aspects according to various embodiments.

FIG. 24 shows a sample servo loop that regulates the external loop flow rate and outdoor heat exchanger 34 fans speed to keep/maintain T_Measured close to the specified target temperature. First, initial values are set:

SET Initial Values
Set Minimum Values
Min Ext Flow=4 GPM Min Fan RPM=150
Set Maximum Values
Max Ext Flow=10 GPM Max Fan RPM=750
Set Internal Pump Value at Fixed Value
Internal Pump Flow Rate=6 GPM
Set Target Temperature
target=Input by User (e.g. 38 C)
Set Gain
Gain=Input by User
(Could be 1*13.1/Q; ... Q is IT load in kW)

The Gain here relates the temperature deltas to the IT head load. Next, the servo loop is initiated:

START of Servo Loop (For rack inlet temperature servo to target temperature)
Measure Rack Inlet Temperature
T rack inlet=Measured Value
Calculate an error signal
T error=T rack inlet−T target
Calculate Control Temperature
Tc=T error*Gain
Divide the Control Temperature proportionately between Ext Pump and Fan
Tp=Tc*Ap/Tpf ... (Example, Tp=Tc*5/12.5)
Tf=Tc*Af/Tpf ... (Example, Tf=Tc*7.5/12.5)
where, Delta T=(T rack inlet−T outdoor ambient)
Tpf=Delta T at min−Delta T at max ext pump & fan speed settings
Ap=Delta T at min−Delta T at max ext pump settings (that is, max Delta T achievable by changing the ext loop flow settings)
Af=Delta T at min−Delta T at max fan speed settings (that is, max Delta T achievable by changing the fan speed settings)

This dependence of Tp and Tf on Tc can be altered based on the cooling system components. Fp(T) is external flow required for a given delta T. For example, Fp=37.43*((−1.0916*Tp+9.1526)^−1.01). Ff(T) is external fan rpm required for a given delta T. For e.g., Ff=669.33*((−0.7107*Tf+6.2004)^−0.8197).

Figure 25:
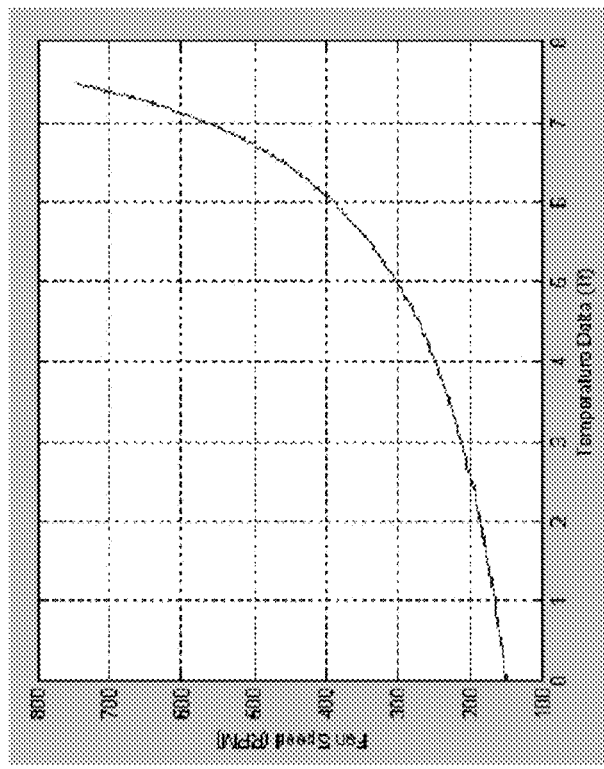
FIG. 25 illustrates exemplary external loop flow rate as a function of Delta T according to various embodiments.
Figure 26:
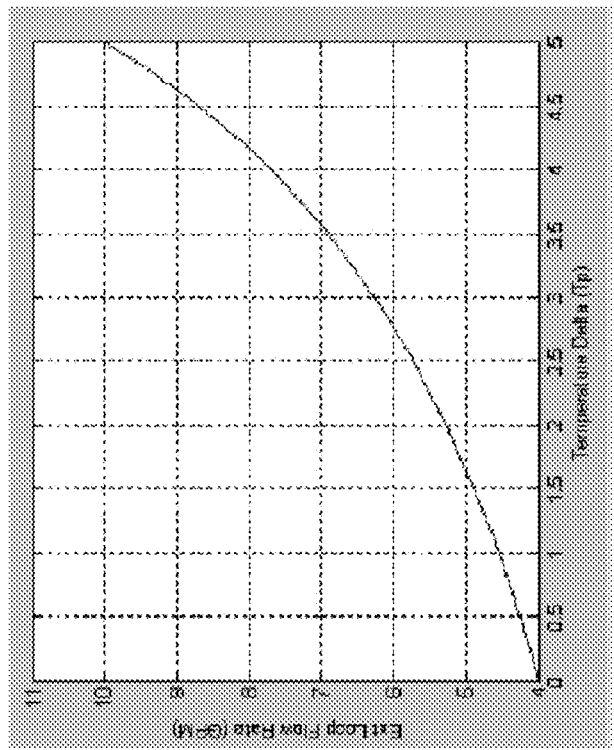
FIG. 26 illustrates exemplary external fan revolutions per minute as a function of Delta T according to various embodiments.

Ext Flow=Fp (Tp)
Fan RPM=Ff (Tf)
Set Limits on Max and Min RPM and Ext Flow
If Ext Flow<Min Ext Flow then Ext Flow=Min Ext Flow
If Fan RPM<Min Fan RPM then Fan RPM=Min Fan RPM
If Ext Flow>Max Ext Flow then Ext Flow=Max Ext Flow
If Fan RPM>Max Fan RPM then Fan RPM=Max Fan RPM
Set New Ext Flow and Fan RPM
External Pump Flow Rate=Ext Flow
Heat Exchanger Fan RPM=Fan RPM
Back to start of loop
END SERVO LOOP FIGS. 25 and 26 illustrate the graph of sample Fp(Tp) and Ff(Tf), respectively, of an example for cooling system 10. According to these functions, in order to get, for example 3 C, from the pump, the pump flow rate should be changed from 4 gpm to ~6.3 gpm and in order to get 3 C from the external fans, the fans speed should be changed from 150 RPM to ~210 RPM.

However, to get a further 1 C from the pump, the pump flow rate should be changed from ~6.3 gpm to ~7.8 gpm and to get a further 1 C from the external fans, the external fans speed should be changed from ~210 RPM to ~250 RPM. In general, this control could be extended to I fans and K pumps and the relationship functions such as Fp and Ff can either be generated analytically or numerically. While this example describes control of the external pump and external fans, similar algorithmic approaches can be applied to the control of internal cooling components including internal pump and server fans.

As will be appreciated by one skilled in the art, aspects may be embodied as a system, method, and/or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the embodiments are described above with reference to flowchart illustrations and/or block diagrams of methods, apparatus (systems) and computer program products according to the embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the various embodiments with various modifications as are suited to the particular use contemplated.

While the preferred embodiment has been described, it will be understood that those skilled in the art, both now and in the future, may make various improvements and enhancements which fall within the scope of the claims which follow. These claims should be construed to maintain the proper protection for the embodiments first described.

What is claimed is:

1. A method for controlling a data center, the method comprising:
    removing heat from a data center using liquid coolant cooled without vapor compression refrigeration on a liquid cooled information technology equipment rack;
    Regulating data center temperature within three distinct zones of control with a controller-apparatus that includes a computer processor, wherein the three distinct zones comprise a first, second and third zone;
    regulating the liquid coolants flow to the data center through a range of liquid coolant flow values with the controller-apparatus based upon information technology equipment temperature thresholds of the data center;
    and
    regulating the data center energy usage by using the controller-apparatus according to at least one of a user selected upper target temperature and a user selected lower target temperature;
    measuring a temperature at the data center;
    measuring a dew point at the data center to obtain the dew point temperature;
    forming the first zone by opening a recirculation valve when the measured temperature at the data center decreases below a minimum target temperature threshold and maintain the data center above the dew point temperature, the recirculation value configured to bypass an outdoor heat exchanger when opened;
    forming the second zone by closing the recirculation valve when the measured temperature at the data center increases above the minimum target temperature threshold;
    operating the data center at a minimum cooling power state when the measured temperature at the data center is between the minimum target temperature threshold and a maximum target temperature threshold;
    and
    forming the third zone by increasing a flow rate of the liquid coolant when the measured temperature at the data center increases above the maximum target temperature threshold.

2. The method of claim 1 further comprising determining at least one of a cooling system pump rpm and a fan rpm based upon at least one of the data center's power consumption and information technology equipment operating temperature.

3. The method of claim 2 further comprising calculating via the controller-apparatus at least one of the cooling system pump rpm and the fan rpm to determine an inlet temperature of the liquid cooled information technology equipment rack.

4. The method of claim 3 further comprising ignoring the outdoor ambient temperature when calculating the inlet temperature of the liquid cooled information technology equipment rack.

5. The method of claim 1 further comprising regulating the data center energy usage by using the controller-apparatus according to at least one of a user selected upper target temperature and a user selected lower target temperature.

6. The method of claim 5 further comprising setting the cooling energy usage via the controller-apparatus to a reduced energy state while maintaining a liquid coolant operating temperature between the user selected upper target temperature and the user selected lower temperature target.

7. The method of claim 5 further comprising engaging additional cooling capacity with the controller-apparatus to limit specific information technology equipment temperatures to a value at or below the user selected upper target temperature.

8. The method of claim 5 further comprising engaging additional cooling capacity while proportionally distributing the additional cooling capacity between a pump rpm and a fan rpm.

9. The method of claim 5 further comprising reducing cooling capacity with the controller-apparatus to limit specific information technology equipment temperatures to a value at or above the user selected lower target temperature.

10. The method of claim 7 further comprising powering down specific information technology equipment when the additional cooling capacity is insufficient.

11. The method of claim 3 further comprising regulating a liquid coolant flow through at least one of a liquid cooled information technology equipment rack, a side car heat exchanger, an outdoor heat exchanger, and a liquid to liquid heat exchanger by changing the pump rpm.

12. The method of claim 11 further comprising bypassing the outdoor heat exchanger to reduce cooling capacity via the controller-apparatus to limit information technology equipment temperatures to a value at or above a user selected lower target temperature.

13. The method of claim 11 further comprising including the outdoor heat exchanger to add cooling capacity via the controller-apparatus to limit information technology equipment temperatures to a value at or below a user selected upper target temperature.

14. The method of claim 1 wherein the controller-apparatus includes a computer processor.

15. A method for controlling a data center, the method comprising:
    removing heat from a data center using liquid coolant cooled without vapor compression refrigeration on a liquid cooled information technology equipment rack;
    Regulating data center temperature within three distinct zones of control with a controller-apparatus that includes a computer processor, wherein the three distinct zones comprise a first, second and third zone;
    regulating the liquid coolants flow to the data center through a range of liquid coolant flow values with the controller-apparatus based upon information technology equipment temperature thresholds of the data center;
    and
    regulating the data center energy usage by using the controller-apparatus according to at least one of a user selected upper target temperature and a user selected lower target temperature;
    measuring a temperature at the data center;
    measuring a dew point at the data center to obtain the dew point temperature;
    forming the first zone by opening a recirculation valve when the measured temperature at the data center decreases below a minimum target temperature threshold and maintain the data center above the dew point temperature, the recirculation value configured to bypass an outdoor heat exchanger when opened;
    forming the second zone by closing the recirculation valve when the measured temperature at the data center increases above the minimum target temperature threshold;
    operating the data center at a minimum cooling power state when the measured temperature at the data center is between the minimum target temperature threshold and a maximum target temperature threshold;
    and
    forming the third zone by increasing a flow rate of the liquid coolant when the measured temperature at the data center increases above the maximum target temperature threshold.

16. The method of claim 15 further comprising calculating via the controller-apparatus at least one of the cooling system pump rpm and the fan rpm to determine a liquid inlet temperature of the liquid cooled information technology equipment rack.

17. A method for controlling a data center, the method comprising:
    removing heat from a data center using liquid coolant cooled without vapor compression refrigeration on a liquid cooled information technology equipment rack;
    Regulating data center temperature within three distinct zones of control with a controller-apparatus that includes a computer processor, wherein the three distinct zones comprise a first, second and third zone;
    regulating the liquid coolants flow to the data center through a range of liquid coolant flow values with the controller-apparatus based upon information technology equipment temperature thresholds of the data center;
    and
    regulating the data center energy usage by using the controller-apparatus according to at least one of a user selected upper target temperature and a user selected lower target temperature;
    measuring a temperature at the data center;
    measuring a dew point at the data center to obtain the dew point temperature;
    forming the first zone by opening a recirculation valve when the measured temperature at the data center decreases below a minimum target temperature threshold and maintain the data center above the dew point temperature, the recirculation value configured to bypass an outdoor heat exchanger when opened;
    forming the second zone by closing the recirculation valve when the measured temperature at the data center increases above the minimum target temperature threshold;

operating the data center at a minimum cooling power state when the measured temperature at the data center is between the minimum target temperature threshold and a maximum target temperature threshold; and forming the third zone by increasing a flow rate of the liquid coolant when the measured temperature at the data center increases above the maximum target temperature threshold.

18. The method of claim 17 further comprising setting the cooling energy usage via the controller-apparatus to a reduced energy state while maintaining a liquid coolant operating temperature between the user selected upper target temperature and the user selected lower temperature target.

19. The method of claim 17 further comprising engaging additional cooling capacity with the controller-apparatus to limit specific information technology equipment temperatures to a value at or below the user selected upper target temperature.

20. The method of claim 17 further comprising reducing cooling capacity with the controller-apparatus to limit specific information technology equipment temperatures to a value at or above the user selected lower target temperature.

* * * * *